United States Patent [19]
Yanagawa

[11] 4,181,963
[45] Jan. 1, 1980

[54] ELECTRONIC CALCULATOR WITH TIME COUNTING FUNCTION

[75] Inventor: Mikio Yanagawa, Akishima, Japan

[73] Assignee: Casio Computer Co., Ltd., Tokyo, Japan

[21] Appl. No.: 895,770

[22] Filed: Apr. 12, 1978

[30] Foreign Application Priority Data

| Apr. 19, 1977 [JP] | Japan | 52-44658 |
| Apr. 19, 1977 [JP] | Japan | 52-44660 |
| Apr. 19, 1977 [JP] | Japan | 52-44669 |

[51] Int. Cl.$^2$ ............... G06F 15/02; G04B 47/00
[52] U.S. Cl. ............... 364/705; 58/50 R; 58/152 R
[58] Field of Search ............ 364/705; 58/50 R, 152 R

[56] References Cited

U.S. PATENT DOCUMENTS

| 3,788,058 | 1/1974 | Idei et al. | 58/50 R X |
| 3,813,533 | 5/1974 | Cone et al. | 364/705 |
| 3,955,355 | 5/1976 | Luce | 364/705 X |
| 4,022,014 | 5/1977 | Lowdenslager | 364/705 X |
| 4,035,627 | 7/1977 | Dickinson et al. | 58/152 R X |

*Primary Examiner*—Jerry Smith
*Attorney, Agent, or Firm*—Flynn & Frishauf

[57] ABSTRACT

An electronic calculator with a time counting function has an input section for inputting various data control signals. When the input section inputs given data or control signals, a given calculating operation is performed in a calculating circuit in accordance with these input signals under control of a calculating control circuit. The electronic calculator comprises an oscillator for outputting a reference frequency signal, a frequency dividing circuit by which an output signal from the oscillator is frequency-divided to produce a given time counting signal, and a time counting circuit in which a time counting operation is executed by the time counting signal from the frequency divider. A holding circuit for holding a time counting signal from said frequency divider is inserted between the frequency divider and the time counting circuit. The holding circuit is provided to smoothly perform a time counting function in the time counting circuit and a calculating function in the calculation circuit, these circuits being asynchronous in operation. The time counting data or calculation data processed in the time counting circuit and calculation circuit are stored in one or more memory circuits and the stored data is properly displayed by a display circuit.

32 Claims, 23 Drawing Figures

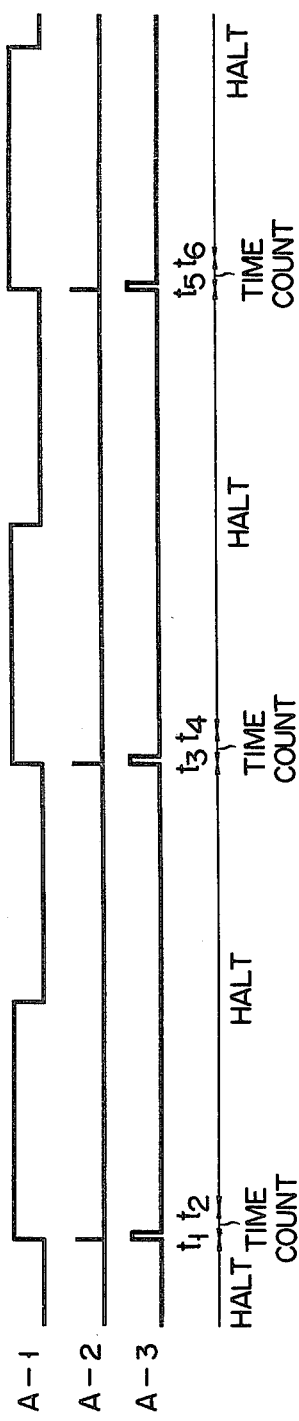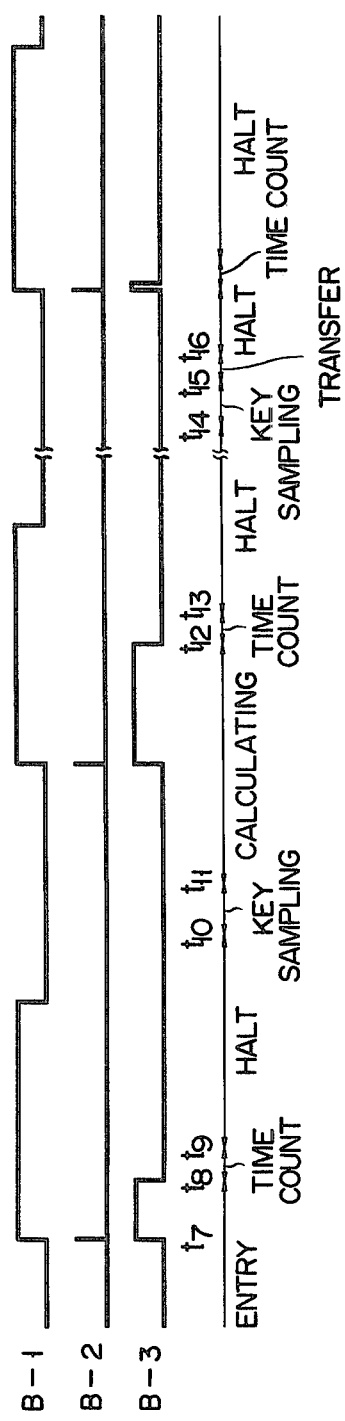

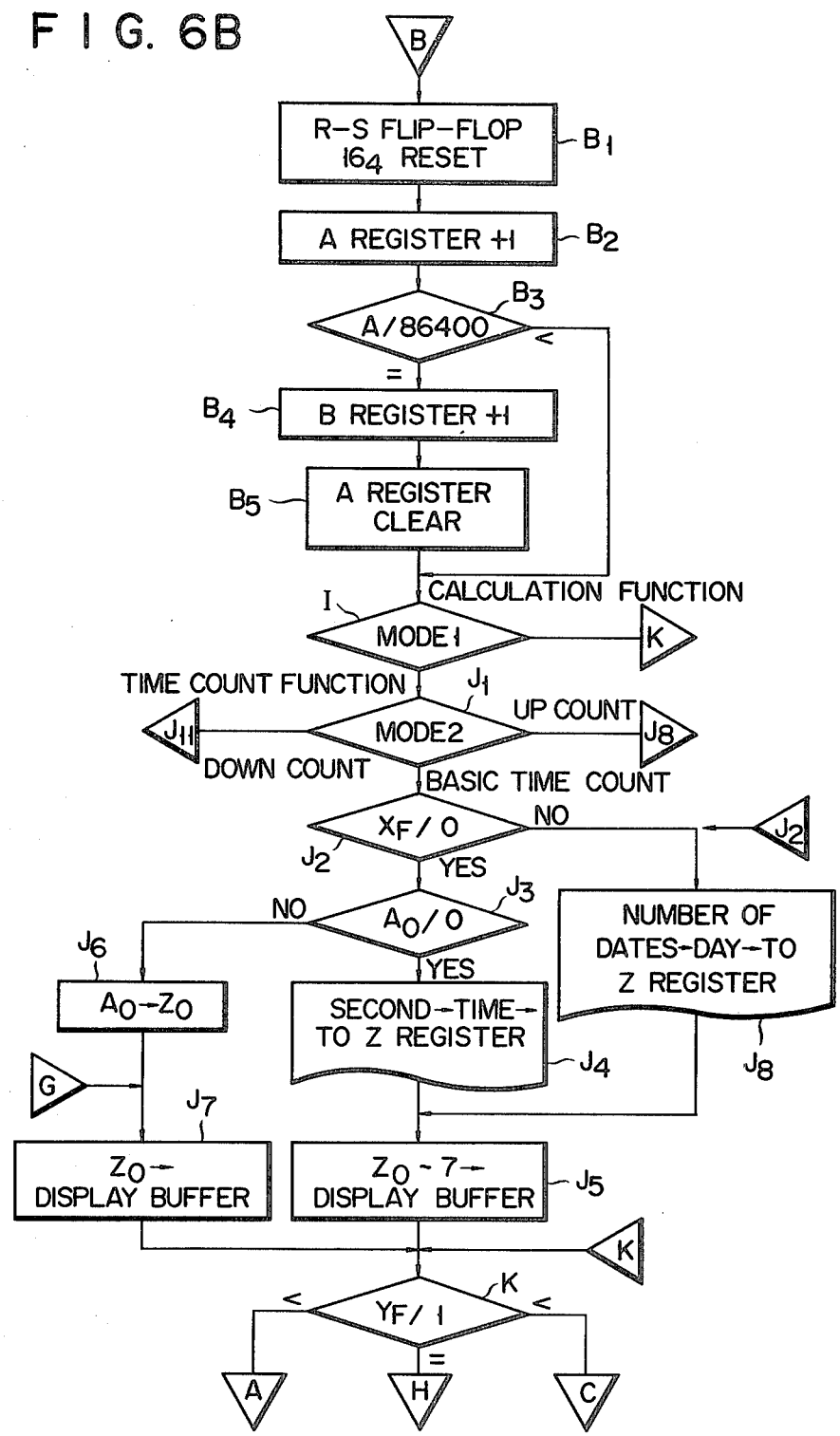

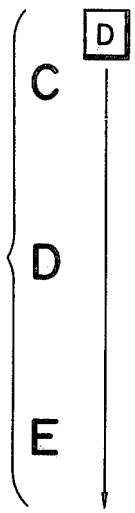

ELECTRONIC CALCULATOR WITH TIME COUNTING FUNCTION

BACKGROUND OF THE INVENTION

This invention relates to an electronic calculator with a time counting function and, more particularly, to the one in which the time counting and calculation operations are well adapted for the control of a microprogram.

In a conventional electronic timepiece, an oscillator such as a crystal oscillator produces an output signal with a fundamental frequency 32.768 KHz, for example. The output signal is frequency-divided into a one second signal and the one second signal is successively counted by a binary counter. When it is intended to realize a multi-function timepiece by using such a convention construction, one encounters a serious problem in that the necessary logical circuits are extremely complex. Incidentally, the multi-function timepiece has, for example, a stopwatch function and a function to display local times in the world, in addition to an ordinary timepiece function. For avoiding such a problem, an attempt has been made in which a microprogram stored in a read only memory (ROM) is used to control the time counting operation in the timepiece.

An electronic timepiece of which the calculating operation is controlled by a microprogram is frequently provided with an additional time counting function, although the time counting operation is asynchronous with the calculating operation. Several attempts have also been made to introduce a microprogram control scheme into the control of the time counting operation.

In controlling the time counting operation by using a microprogram, a shift register, for example, is used for the calculating register and the data are processed for each word (each memory digit of the calculating register is one word). That is, if one processing time is fixed (time taken for one circulation of the memory contents of the calculation register), "1" is added to a preliminary counter every time given words are processed. Through this, a correct counting is ensured. However, when a random access memory (RAM) is used for the memory device and one word unit is processed, if the processing time is unfixed, a number of steps are necessary for processing if the above mentioned method is used. Accordingly, the area of the ROM occupied by the microprogram is enlarged. In the case of such an unfixed processing time, when the frequency divider produces a given timing signal for time counting, a series of processings currently executed are temporarily stopped and after the address at the return is stored in a given memory, the time counting is executed. Due to the foregoing, an electronic calculator with a time counting function frequently followed by has disadvantages whereby the calculation time is different and the display duty is different for each row.

In the time display, it is necessary that the display time and the real time coincide with each other. However, when an electronic calculator with a time counting function operates in a calculation mode without displaying time, the time counting in the inside of the calculator is not necessarily coincident with real time.

An electronic calculator with a time counting function generally employs C-MOS (complementary MOS) LSI for the circuit and liquid crystal for the display part, with an intention of reduction of power consumption, weight and size. In the C-MOS LSI, the smaller the number of switching devices in the C-MOS circuit, the lesser the power consumption. In other words, reduction of pulses relating to various operations contributes greatly to reduction of the power consumption. However, in the conventional calculator of this type, every time that the contents of one of the digits of display data is changed, the contents of all the digits of the display buffer are completely renewed. Accordingly, the convention calculator needs display control pulses for controlling the drive of all the digits of the display buffer for each data renewal. This leads to a great amount of wasteful power consumption.

Accordingly, an object of the invention is to provide an electronic calculator with a time counting function in which time counting and calculation, these being asynchronous in operation, may be correctly performed without any deterioration in the operation.

Another object of the invention is to provide an electronic calculator with a time counting function in which the operations of the time counting and calculation are well adapted for the control of a microprogram.

Still another object of the invention is to provide an electronic calculator with a time counting function which is operable with minimum power consumption.

An additional object of the present invention is provide an electronic calculator with a time counting function in which time counting and calculation, these being asynchronous in operation, are controllable by a single microprogrammed controller and, in the time display, a display of correct time is ensured.

SUMMARY OF THE INVENTION

To achieve the above objects, there is provided an electronic calculator with a time counting function comprising: oscillating means for generating a reference frequency signals; frequency dividing means for frequency-dividing the output signal from the oscillating means to produce given timing signals for time counting; holding means for holding the output signal from the frequency dividing means; time counting control means for controlling the execution of the time counting of the time counting means; input means for inputting given data or control signals; calculating means for performing a calculation in accordance with the input signal from the input means; calculation control means for controlling the execution of the calculation operation of the calculating means; at least one memory means for storing calculation data and time counting data processed by the time counting means and calculating means; and display means for displaying the contents of the memory means.

By virtue of the provision of the holding circuit for holding the timing signals outputted from the frequency-dividing means every reference time counting unit, even if the timing signal is produced in the course of the execution of a series of calculation processing routines, the time counting processing routine is executed depending on the output signal from the holding circuit, after the calculation processing routines are executed. As a result, the time counting and calculation functions are performed without any deterioration of the operation and the control of the operations is simple and sure.

Because of the provision of the holding circuit, it is unnecessary to interrupt the series of processing operations with the time counting operation. The number of the control steps is extremely small so that the memory area of the microprogram is reduced. Therefore, the calculator of the invention is well adapted for microprogram control.

Further, the electronic calculator of the invention includes judging means to judge whether the contents of the digit calculated needs to be changed or not when calculated data is displayed. When it is judged that digits must be changed, display control signals are outputted to all the digits to be changed. When it is unnecessary to change the contents of given digits, the display control signal is applied to only the digit to be or changed. The display data corresponding to the digits having the display control signals are loaded into a display buffer of static type. With such a construction, occurrence of the display control signals is minimized, resulting in the reduction of power consumption, without any damage of the display operation.

Furthermore, the present invention controls so as to change the address in the address register of the microprogram controller by using the key input signals and time counting output signals. Therefore, if an identical key is continuously depressed before and after the change of the time counting contents, the display contents may be renewed in accordance with the time counting contents, thus ensuring a correct display of time.

BRIEF DESCRIPTION OF THE DRAWINGS

FIGS. 5A and 5B are a time chart for illustrating the operation of the respective circuits when the calculator is operated in accordance with the flow chart in FIG. 4;

FIGS. 6A to 6C are flow charts for illustrating the further details of the flow chart in FIG. 4 and are used for illustrating the operation in FIG. 1;

FIGS. 9A to 9F illustrate the change of the contents of A register, B register, C register and Flags $X_F$ and $Y_F$.

DETAILED DESCRIPTION

Figure 1A:
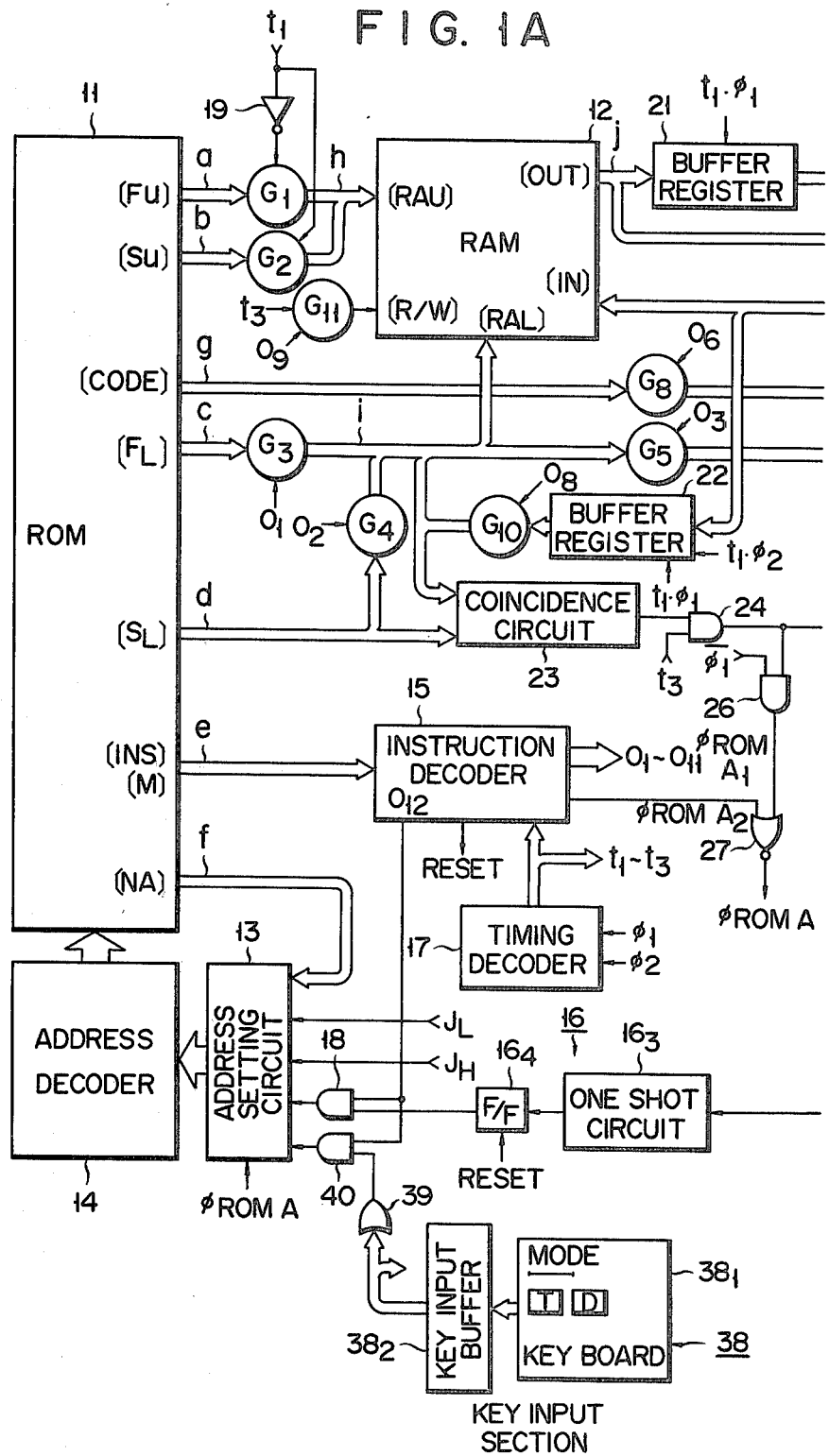
FIGS. 1A and 1B show a block diagram of an entire electronic calculator with a time counting function which is an embodiment of the invention.
Figure 1B:
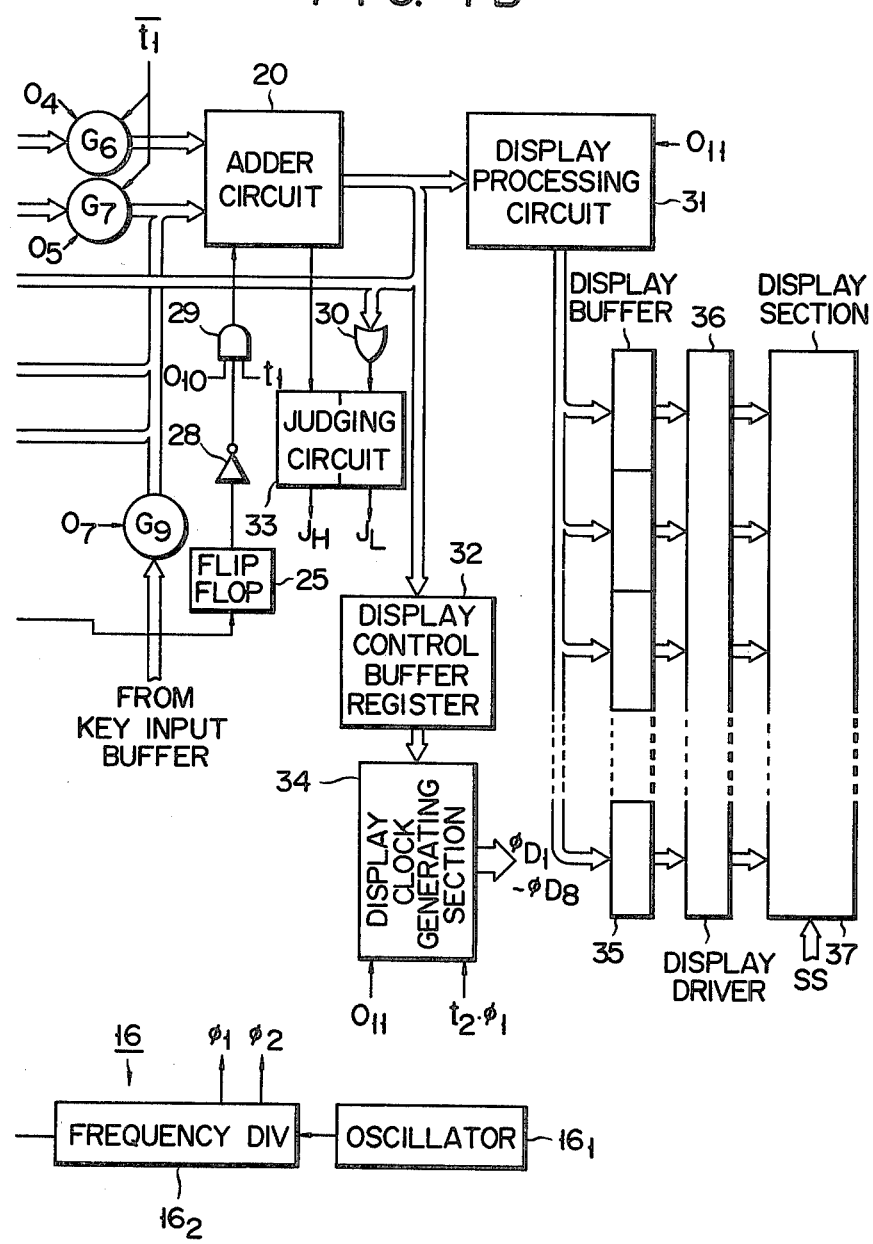

Reference is made to FIGS. 1A and 1B wherein an reference numeral 11 designates a read only memory (ROM) storing various micro-instructions. The ROM 11 produces various output signals through bus lines a to g. In these output signals, a signal ($F_U$) designates row addresses of a register storing a first operand of a random access memory (RAM) 12 to be described later. A signal ($S_U$) designates row addresses of a register storing a second operand. A signal ($F_L$) designates column addresses or a processing initiation address of the register for storing operands in the RAM 12. A signal ($S_L$) designates column addresses or a processing end column address of a register storing operands. An instruction signal (INS) includes operation instructions, transfer instructions and the like. A mode setting signal (M) switches the modes of the signals ($F_L$) and ($S_L$). A signal (NA) designates an ensuing address. A signal (CODE) includes various signals representing various numeral codes. The signal (NA) outputted via the bus line f is temporarily stored in an addressing circuit 13 of which the output is coupled with an address decoder 14. The address decoder 14 decodes the signal from the addressing circuit 13 into a corresponding address which in turn addresses the ROM 11. The signals (INS) and (M) are applied via the bus line e to an instruction decoder 15. The instruction decoder 15 produces control signals $O_1$ to $O_{12}$ and a reset signal (RESET) to an R-S flip-flop $16_4$ as will subsequently be described, in synchronism with three phase timing signals $t_1$ to $t_3$ inputted from a timing decoder 17. The timing decoder 17 decodes $\phi_1$ and $\phi_2$ output signals from a clock pulse generator 16 to produce the timing signals $t_1$ to $t_3$. The clock pulse generator 16 comprises an oscillator $16_1$ for generating a pulse signal of a reference frequency by using a quartz crystal, for example, a frequency divider $16_2$ for producing clock pulses $\phi_1$ and $\phi_2$ and a signal with one second period. A one-shot circuit $16_3$ connected to the output terminal of the frequency divider $16_2$ and an R-S flip-flop circuit $16_4$ which is set by the output signal of the one-shot circuit $16_3$ and is reset by a reset pulse from the instruction decoder 15. The output signal of the R-S flip-flop circuit $16_4$ is applied to the addressing circuit 13, by way of an AND gate 18.

The signals ($F_U$) and ($S_U$) for addressing the column addresses of the register of the RAM 12 are applied through the bus lines a and b to gate circuits $G_1$ and $G_2$ of which the outputs are applied to the row address input terminal (RAU) of the RAM 12, through a bus line h. The timing signal $t_1$ is applied through an inverter 19 to the gate $G_1$ and directly applied to the gate $G_2$, for the purpose of gating these gates.

Table 1

|     |     |     |
| --- | --- | --- |
| M=1 | $F_U$ | Row designation of first operands |
|     | $S_U$ | Row designation of second operands |
|     | $F_L$ | Column designation of first operands |
|     | $S_L$ | Column designation of second operands |
| M=0 | $F_U$ | Row designation of first operands |
|     | $S_U$ | Row designation of second operands |
|     | $F_L$ | Designation of start column |
|     | $S_L$ | Designation of end column |

As seen from Table 1, the signals ($F_L$) and ($S_L$) are used for column address designation of the register storing first and second operands when a mode signal (M) is "1". These designate the addresses of processing start and end columns when the (M) is "O". These signals pass through the bus lines c and d to reach gate circuits $G_3$ and $G_4$ which are gated by the output signals $O_1$ and $O_2$ of the instruction decoder 15. The outputs of the gate circuits $G_3$ and $G_4$ are both outputted onto an input/output common bus line i and inputted to the column address input terminal (RAL) of the RAM 12, and at the same time the second input terminal b of an adder 20 via a gate $G_5$ controlled by a control signal $O_3$ from the instruction decoder 15.

The RAM 12 includes accumulator registers of X, Y and Z, a display register, a register for storing time counting value, a register for storing date, and other various registers, these registers being arranged in rows. These registers are designated by signals from the row address input terminal (RAU). The digits of the respective registers are specified by signals inputted from the column address input terminal (RAL). The first and second operands or the data for transfer and the like which are read out through the addressings of row and column are temporarily stored in a latch circuit included in the RAM 12 and then outputted from the output terminal (OUT) in the form of data of parallel four bits. The data outputted are inputted through a bus line j to a buffer register 21 of which the loading operation is controlled by the timing signals $t_1$ and the clock signal $\phi_1$ and the reading operation, by the clock signal $\phi_2$. The data stored in the buffer register 21 is applied through a gate circuit $G_6$ controlled by a signal $O_4$ from the instruction decoder 15 to the first input terminal a of the adder 20 performing parallel addition/subtraction operations. The data outputted from the output terminal (OUT) of the RAM 12 onto the bus line j are transferred to the second input terminal b of the adder 20, through a gate circuit $G_7$ controlled by the timing signal $\overline{t_1}$ and a signal $O_5$ outputted from the instruction decoder 15. In this example, the signal ($S_U$) for designating the row address of the register storing the first operand is outputted from the gate $G_2$ at the timing of $t_1$. The signal ($F_U$) for specifying the row address of the register storing the second operand is outputted from the gate $G_1$ at the timing of $t_2$ and $t_3$. The first operand in the data to be sent out onto the bus line j is stored in the buffer register 21 and then is applied to the first terminal a of the adder 20 via the gate $G_{16}$. The second operand is applied to the second input terminal b of the adder circuit 20 through the gate $G_7$ at the timings of $t_2$ and $t_3$. The second input terminal b of the adder 20 receives the signal (CODE) of numerical code derived from the ROM 11 through the gate $G_8$ controlled by a control signal $O_6$ outputted from the instruction decoder 15 and further receives a signal derived from a key input unit 38 to be described later through a gate $G_9$ controlled by a control signal $O_7$ outputted from the instruction decoder 15. Upon receipt of the data or signal at the first and second terminals, the adder 20 executes increment or decrement of the row address of the RAM. In an operation mode, it executes various operations such as arithmetic operations. In a time counting mode, it executes various operations necessary for time counting such as "+1" or "−1" operation against the registers for storing time and date. The output of the adder (the result of the calculation) 20 is loaded into a buffer register 22 of which the loading operation is performed at the timings of $t_1$ and $\phi_1$ and the reading operation at the timings of $t_1$ and $\phi_2$. The output thereof is loaded into a given register of which the loading operation is executed at the timing of $t_3$ and $\phi_1$, the register being included in the RAM 12. The data (address) loaded into the buffer register 22 is read out at the timings of $t_1$ and $\phi_2$ and sent out through a gate circuit $G_{10}$ controlled by a signal $O_8$ outputted from the instruction decoder 15. The data outputted from the buffer register 22 through the gate $G_{10}$ are applied to the row address input terminal (RAL) of the RAM 12, to the adder 20 by way of the gate $G_5$ and to a coincident circuit 23 together with the column address signal ($S_L$) outputted from the ROM 11. The operations in the RAM 12 with respect to the timing signals $t_1$ to $t_3$ are tabulated as in Table 2.

Table 2

| $T_1$ | S | Reading-out of the first operand |
|---|---|---|
| $t_2$ | F | Reading-out of the second operand |

Table 2-continued

| $t_3$ | F | Writing-in of the result of calculation |
|---|---|---|

The reading and writing operations of the RAM 12 are controlled by a signal $O_9$ of the instruction decoder 15 and the timing signal $t_3$ applied to the R/W terminal of the RAM 12 via a gate $G_{11}$.

The output signal of the coincident circuit 23 is applied to an AND gate 24, together with the timing signal $t_3$. The output of the AND gate 24 is applied to a flip-flop 25 operable at the timings of $t_3$ and $\phi_1$ and to an AND gate 26 to which a clock signal is applied. An address control signal $\phi_{ROMA1}$ from the AND circuit 26 is applied to an NOR circuit 27, together with an address control signal $\phi_{ROMA2}$ from the instruction decoder 15. An address reading control signal $\phi_{ROMA}$ from the NOR circuit 27 is applied to the control terminal of the addressing circuit 13. The output of the flip-flop 25 is applied to an AND gate 29 via an inverter 28. The timing signal $t_1$ and an address stepping instruction signal $O_{10}$ from the instruction decoder 15 are applied to the AND circuit 29 of which the output is applied to the carry input terminal of the adder 20. In the adder 20, the carry of the data is temporarily held to execute a carry operation. The output of the adder 20 is inputted to a display processing circuit 31 and to an OR gate 30, and to a buffer register 32 as well. The output of the OR circuit 30 and the carry output of the adder 20 are applied to a judgement circuit 33. The judgement circuit 33 produces judging signals $J_L$ and $J_H$ which are in turn applied to the addressing circuit 13 where these signals designate a branch address in the ROM 11. The buffer register 32 stores an address signal (column address) relating to the display digit contents inputted to the display processing circuit 31 in a display mode. The address signal stored in the buffer register 32 is applied to a display block generator 34. Receiving a display instruction signal $O_{11}$ outputted from the instruction decoder 15, the timing signals $t_1$ and the clock signal $\phi_1$, the display clock generator 34 decodes the address signal to produce display control signals $\phi_{D1}$ to $\phi_{D3}$ peculiar to the address signal. The display processing circuit 31 operates upon receipt of a display instruction $O_{11}$ outputted from an instruction decoder 15 to decode the display data of each digit and then to convert them into display segment signals by a segment encoder. The segment signals from the display processing circuit 31 are applied to the data input terminals of respective digits of a static type display buffer 35. The display control signals $\phi_{D1}$ to $\phi_{D3}$ outputted from the display clock generator 34 are applied to the control terminals of the corresponding digits of the buffer 35. The display segment signals outputted from the display processing circuit 31 are loaded into the corresponding digit of the display buffer 35 which is specified by the display control signal $\phi_{D1}$. That is, the display buffer 35 is of a static type so that the contents of the digits not receiving the display control signal $\phi_{D1}$ are held as they stand and the contents of only the digit receiving the display control signal $\phi_{D1}$ is renewed. The respective digit output signals from the buffer 35 are applied to a display section (8 digits construction, in this example) 37 having received a drive signal SS, through a display driver 36. A key input section 38 includes a key board $38_1$ and a key input buffer $38_2$ for temporarily storing key operation signals outputted from the key board $38_1$. On the key board $38_1$ are properly arranged ten keys (not shown), function keys (not shown), mode switch for selecting operation and time counting modes, first specifying key ⊤ to instruct the system to send the contents of the register storing the digitalized time to the display section 27, a second D specifying key for instructing it to send the contents of the register storing date in the RAM 12 to the display section 37, and the like. The output signal from the buffer $38_2$ is applied to the second input terminal b of the adder circuit 20 by way of the gate circuit $G_9$ and to the addressing circuit 13 via an OR gate 39 and an AND gate 40. The AND gates 18 and 40 are both enabled by a control signal $O_{12}$ outputted from the instruction decoder 15. The outputs of these AND gates have the function similar to that of the judging signals $J_L$ and $J_H$ outputted from the judgement circuit 33. In other words, these outputs are properly combined to specify a branch address of the ROM 11.

Figure 2:
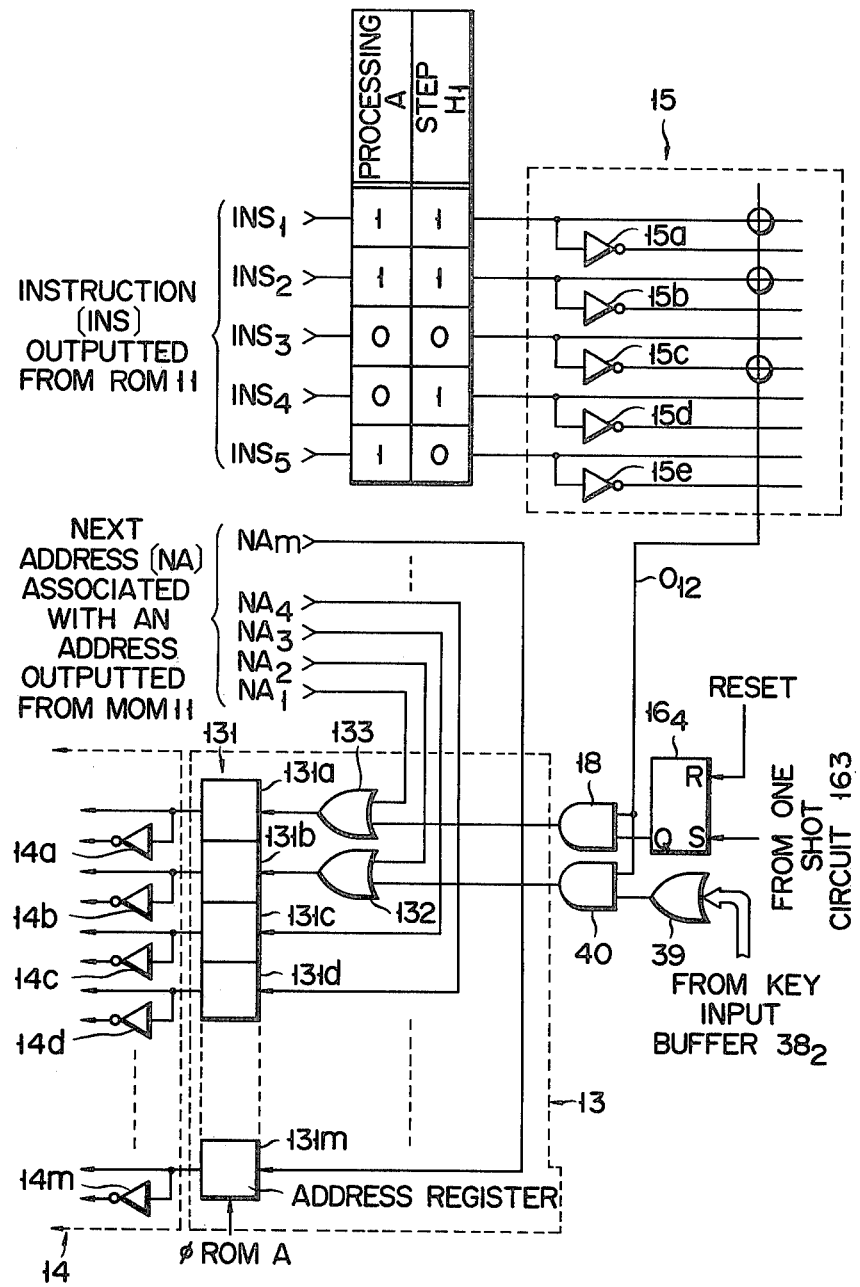
FIG. 2 shows a circuit diagram of an addressing circuit in FIG. 1A.

FIG. 2 shows a circuit construction to make the address-branching by using the control signal $O_{12}$ from the instruction decoder 15. The addressing circuit 13 is comprised of an address register 131, an OR gate 132 and an AND gate 133. The output of the key input buffer $38_2$ is applied to the OR gate 132, together with an address signal outputted onto a line $NA_2$ of a next address (NA) of itself outputted from the ROM 11 via an AND circuit 49. The output of the OR gate 132 is applied to a second bit 131b. The R-S flip-flop $16_4$ is connected at the Q output to the OR circuit 133, together with the address signal outputted to a line $NA_1$ of the next address of itself outputted from the ROM 11 via the AND gate 18. The output of the OR gate 133 is inputted to the first bit 131a of the address register 131. Other output signals of the next addresses (NA) of themselves outputted from the ROM 11, i.e. the address signals outputted via lines $NA_3$ to $NA_m$, are directly applied to the corresponding bits 131c to 131m of the address register 131, except that the output signal of the judging circuit 33 are inputted through an OR circuit (not shown), as in the above case. The output signals from the address register 131 (131a to 131m) are applied to the address decoder 14 where these input signals are decoded through inverters 14a to 14m to produce a specified address signal directed to the ROM 11. The condition that the AND gates 18 and 40 are enabled to permit a key operation output signal and a one-second signal to input into the addressing circuit 13 is that, in this example with the instruction signal (INS) of 5 bits from the ROM 11, the respective instruction signals, for example, $INS_1$ to $INS_5$ satisfy the condition "110xx", i.e. the upper three bits are 110. In a processing $A_1$ and a step $H_1$, "11001" and "11010" instruction signals (INS) are outputted under this condition. The processing and step will be subsequently described. The instruction signal (INS) is applied to the instruction decoder 15. In the instruction decoder 15, the instruction signal inputted is logically processed through inverters 15a to 15e and then outputted therefrom. The control signal $O_{12}$ outputted therefrom to the AND gates 18 and 40 is permitted in its outputting only when the logical conditions of the signals $INS_1$, $INS_2$ and $INS_3$ are satisfied.

Figure 3:
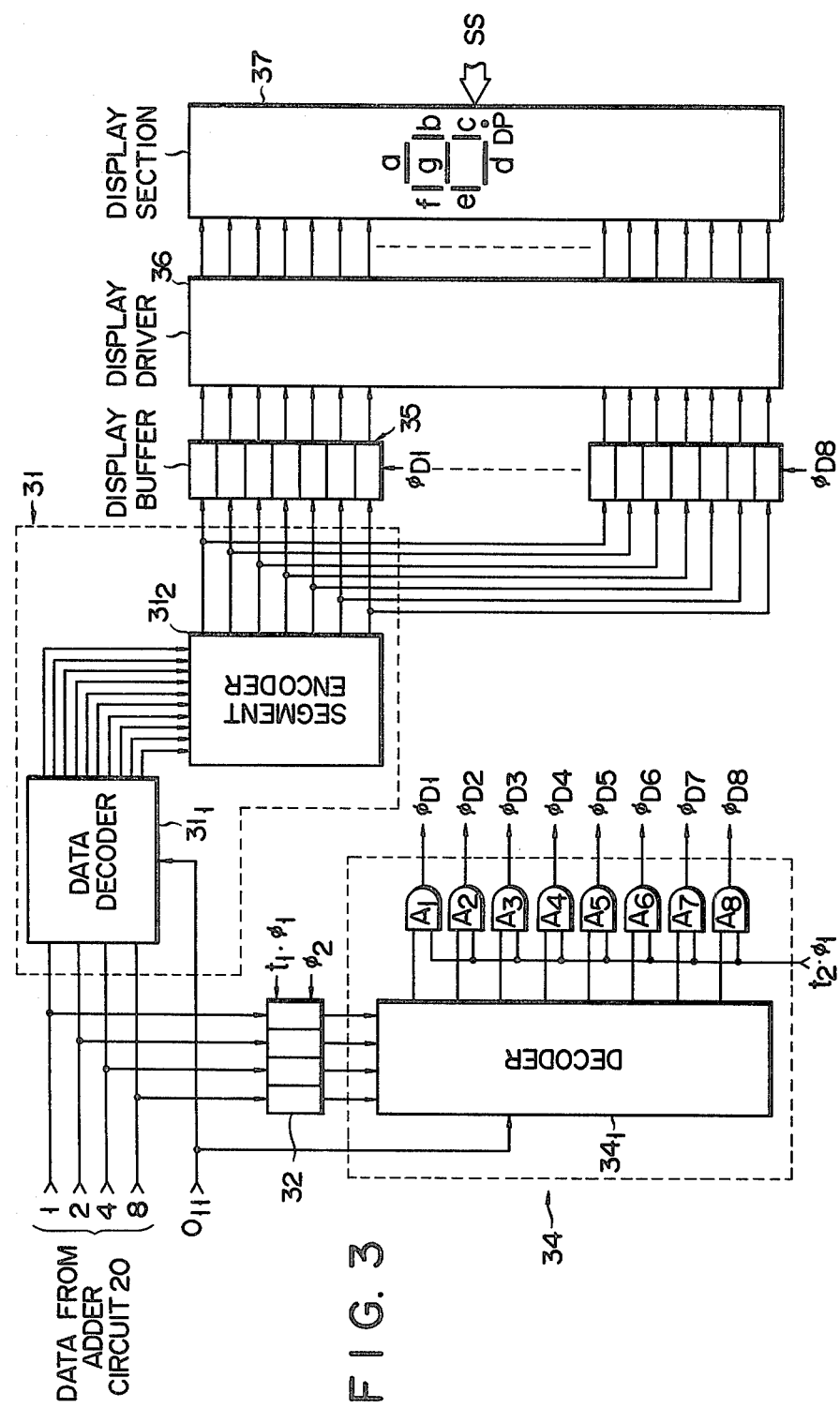
FIG. 3 shows a circuit diagram of a display buffer and its associated portion in FIG. 1B.

FIG. 3 shows the details of the display control system. In the figure, the display data of 4 bits via the adder 20 is decoded by a decoder $31_1$ of the display processing circuit 31 and then inputted into the segment decoder $31_2$ of which the outputs a to g are inputted into the respective input terminals of digit data of the static type display buffer 35. The address data obtained via the adder 20 are loaded into the display control buffer register 32 by the signals $t_1$ and $\phi_1$ and is applied to a decoder $34_1$ of the display clock generator 34 upon application of the clock signal $\phi_2$. In the decoder $34_1$, the address data are decoded and then outputted from output control gates $A_1$ to $A_8$ in synchronism with the signals $t_2$ and $\phi_1$. In this manner, the display control signals $\phi_{D1}$ to $\phi_{D8}$ inherent to the address data outputted from the output control gates $A_1$ to $A_8$ are supplied to the control terminals of the corresponding digits in the display buffer 35. The output signals from the respective digits of the display buffer 35 are transferred to the display driver 36 for AC-driving the display section (liquid crystal type, for example) 37. At this time, the display section 37 has received the scanning signal SS for dynamic drive. In FIGS. 1 to 3, a decimal point display buffer for storing the display position of a decimal point is omitted for simplicity.

The entire operation of the embodiment of the electronic calculator with time counting function thus far described will be given with reference to FIG. 4. Assume now that an instruction "HALT" (waiting condition) is issued from the ROM 11, as indicated by a processing A. At this time, the instruction signal is "11001" as shown in FIG. 2. Accordingly, the instruction signal "11001" satisfies the condition "110xx" so that the instruction decoder 15 produces the control signal $O_{12}$. The AND gates 18 and 40 produce the one second signal. And the R-S flip-flop $16_4$ is set or and/or a given key on the key input section 38 is actuated and the key actuation signal is outputted from the key input buffer $38_2$. In such a condition, the OR gates 132 and/or 133 produce an output signal "1" and thus the address is changed in the addressing circuit 13. The operation proceeds to processing B, C or D. In more particular, under the "HALT" condition in the processing A, if the AND gate 18 produces an output signal, a "basic timepiece calculation" in the processing B. When the AND gate 40 produces an output signal, a "key sampling" in the processing C is executed. When the AND gates 18 and 40 produce both output signals simultaneously, a "flag set" in the processing D is executed and then the "basic clock operation" is executed. Through the execution of the "key sampling", the key actuated on the key input section is detected. When the key detected is a ten key, the operation proceeds to an "entry processing" in a processing E. When the key detected is a function key, an "operation processing" in a processing F is executed. Following these steps of processing, the operation proceeds to a processing G. In the processing G, the contents of the display register in the RAM 12 is transferred to the display buffer 35. Then, a succeeding processing H executes "key one second signal presence and chattering prevention". In the course of the execution of the processing H, the one-second signal is produced to set the R-S flip-flop $16_4$, with the result that the AND gate 18 produces an output signal "1". In this case, the operation returns to the processing B. When the one-second signal is not outputted until the chattering time elapses, the operation then returns to the processing A. In a specified step (to be described later) of the processing H, as shown in FIG. 2, the ROM 11 produces the instruction signal "11010" and the instruction decoder 15 produces the control signal $O_{12}$. As a result, the AND gates 18 and 40 are both enabled and the address is modified in the addressing circuit 13, by the Q output of the R-S flip-flop $16_4$ and the output signal of the OR gate 39.

Following the processing B, a processing I is executed. In the processing I, it is judged whether the mode switch on the key board $38_1$ indicates the operation function or the time counting function. When it indicates the time function, preparation is made of the processing of another time piece such as, for example, a stopwatch (up-count) or a timer (down-count), and a display format of the basic timepiece or the other timepiece, and additionally a display mode changing processing is performed to determine the data to be transmitted to the display buffer. Then, the operation advances to a processing K to judge whether the processings B, I and J or the processings B and I are performed following the processing D or outputting the one-second signal in the course of the execution of the processing H. When the processing I judges that the operation function is indicated, the operation of the system advances directly to the processing K without executing the processing J. The operation returns to the processing C when the processings B, I and J or B and I are performed after the processing D is executed. It proceeds again to the step A when the processings B, I and J or B and I are executed without executing the processing D. It proceeds again to the processing H when the processings B, I and J or B and I are executed with producing the one-second signal during the execution of the processing H.

As described above, the present system is so constructed as to provide roughly three processing routines in accordance with the combination of the output signals of the AND gates 18 and 40. A first processing routine is a time counting processing routine including the processings B, I and J or B or I executed when only the AND gate 18 is enabled. A second routine is an operation routine including the processings C and E or F and G when only the AND gate 40 is enabled. A third routine is a combination of the time counting and operation routines including processings D, B, I, J, K, C, E or F and G, or the processings D, B, I, K, C and E or F and G, when the AND gates are both enabled.

The executions of the routines in accordance with the flow chart in FIG. 4 will be explained with reference to FIGS. 5A and 5B.

FIG. 5A illustrates a case where the time counting data relating to the time counting function is displayed by the mode switch of the key board $38_1$. This case corresponds to the executions of the processings A, B, I, J and K in FIG. 4. When the frequency divider $16_2$ produces the one-second signal as indicated by A-1 in FIG. 5A in the "HALT" condition of the processing A, the one-shot circuit $16_3$ produces one trigger pulse as indicated by A-2 at the leading edge of the one-second pulse. The trigger pulse A-2 is applied to the set terminal (S) of the R-S flip-flop $16_4$ so that the R-S flip-flop $16_4$ is set at time $t_1$ and the Q output signal as indicated by A-3 is applied to the addressing circuit 13 via the AND gate 18. The OR gate 133 of the addressing circuit 13 produces a signal "1" in responsive to this, with the result that the head address of the processing B is set in the address register 131. Following this, the execution of the time counting processing routine starts. In the time counting processing routine, the processings B, I and J are executed since the time counting mode has been now selected by the mode switch of the key board $38_1$. The processing B executes the resetting of the R-S flip-flop $16_4$ and the time counting operation such as the application of "+1" (second) to the register storing time in the RAM 12. The details of the processing B will be referred to later. As a result of the judgement in the ensuing processing I, the system operation advances to the processing J in which the display format is prepared and the display data is selected for the display buffer 35. As a result of the judgement by the processing step K, these processings are executed without the execution of the processing D so that the system operation proceeds to the processing A "HALT". In this manner, the processings B, I, J and K shown in FIG. 4 are completed at time $t_2$ shown in FIG. 5A. Upon completion of the these processings, the time data at that time is set in the display buffer 35 and displayed in the display section 37. The "HALT" condition of the processing A continues until the flip-flop $16_4$ is set. Then, when the frequency divider $16_2$ produces the one second signal at time $t_3$, the time counting processing routine is repeated at the period of time $t_3$ to $t_4$. This is correspondingly applicable for the situation at the time period $t_5$ to $t_6$.

As just described, in the example shown in FIG. 5A, as the frequency divider $16_2$ produces the one-second signal, the time counting is immediately executed and the contents of the time counting is displayed in the display section 37.

FIG. 5B illustrates a case in which the mode switch of the key board $38_1$ selects the operation function to execute the operation function and the time counting function as well. In this case, the display section 37 displays the data relating to the operation function (for example, the entry contents or the calculation result). For this, if the flip-flop $16_4$ is set, the time counting operation is not executed in the course of the execution of the operation function. That is, at time $t_7$, the frequency divider $16_2$ produces the second signal as indicated by B-1 in FIG. 5B and a trigger pulse as indicated by B-2 goes via the one-shot circuit $16_3$ to trigger the R-S flip-flop $16_4$ as indicated by B-3. In this case, if the "entry processing", that is to say, the processing E as shown in FIG. 4, is executed, the execution of the "entry processing" is continued without any interruption. The contents of the entry is transferred to the display buffer 35 in the processing $G_1$. The system operation advances to the processing B via the processing A of "HALT". Then, the processings B, I and K shown in FIG. 4 are executed during the time period $t_8$ to $t_9$. At present, the operation function is selected. Therefore, the operation proceeds to the processing K, upon judgement of the processing I. However, the operation proceeds to the processing A of "HALT" since the processings B and I are executed without executing of the processing D. Then, any one of the function keys is operated, with the result that the operation advances from the "HALT" of the processing A to the processing C of "key sampling" and the "key sampling" is performed during the time $t_{10}$ to $t_{11}$. Since the function key operated is a function key, the operation proceeds to the processing I where a given calculation is performed. In the execution of this, the one second signal outputted from the frequency divider $16_2$ is held in the R-S flip-flop $16_4$. After the processing F is ended, the processings B, I and K are performed during the period of time $t_{12}$ to $t_{13}$. Accordingly, when the operation function is selected by the mode switch on the key board $38_1$, there is a case where the time counting time in the register storing the time of the RAM 12 is not coincident with the real time. However, an ordinary calculation processing continues for at most one second. For this, there is not possibility that an erroneous counting takes place. For example, when the first specifying key ⟨T⟩ to make a display of the contents of time counting at $t_{14}$ is operated, the sampling of the key is performed during the time period $t_{14}$ to $t_{15}$, with the result that the operation proceeds to the processing F and the contents of the register storing the time is transferred to the display register during the time period $t_{15}$ to $t_{16}$. Then, the contents of the display register is transferred to the display buffer 35 and is displayed in the display section 37. The contents of the display at this time is coincident with the real time since the time counting has been completed. When the display succeedingly continues as to the contents of the time counting, the time is counted without lagging behind the real time so that displayed is the contents of the time counting coincident with the real time.

Figure 4:
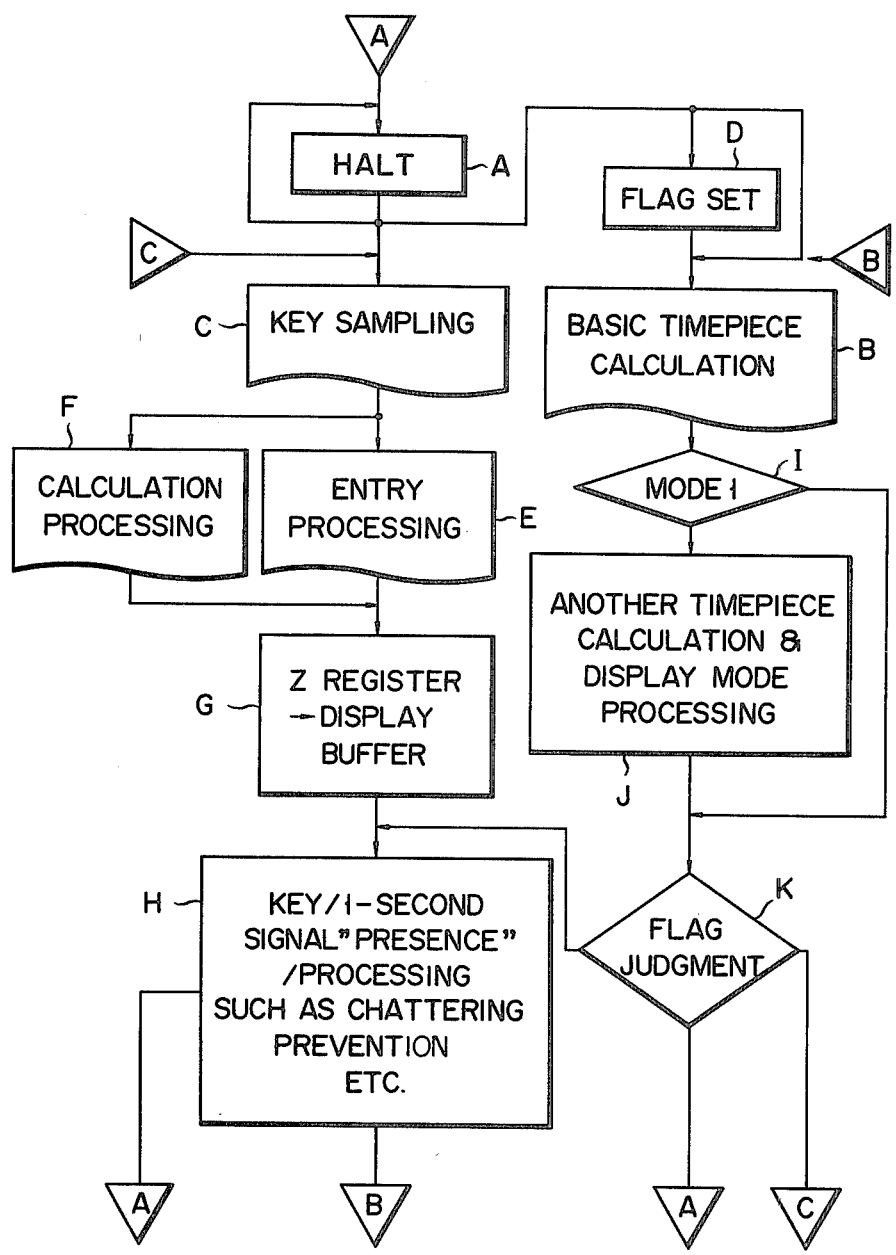
FIG. 4 shows a flow chart for illustrating the operation of the embodiment of the invention.

The explanation to follow is the further elaboration of the flow chart of FIG. 4. Reference is mainly made to FIGS. 6A to 6C, FIGS. 7A to 7E and FIGS. 8A and 8B. For easy of explanation, the following assumption will be made as to the registers. An A register (basic calculation) and a C register (another register) are used for the register for storing the time; a B register for the register for storing the date; X and Y registers for an accumulator register; a Z register for the display register. The data storing capacity (data digits) of each of these registers in 8 digits. The accumulator registers X and Y are provided with flag digits $X_F$ and $Y_F$, respectively, which are used for branching operation.

Figure 6A:
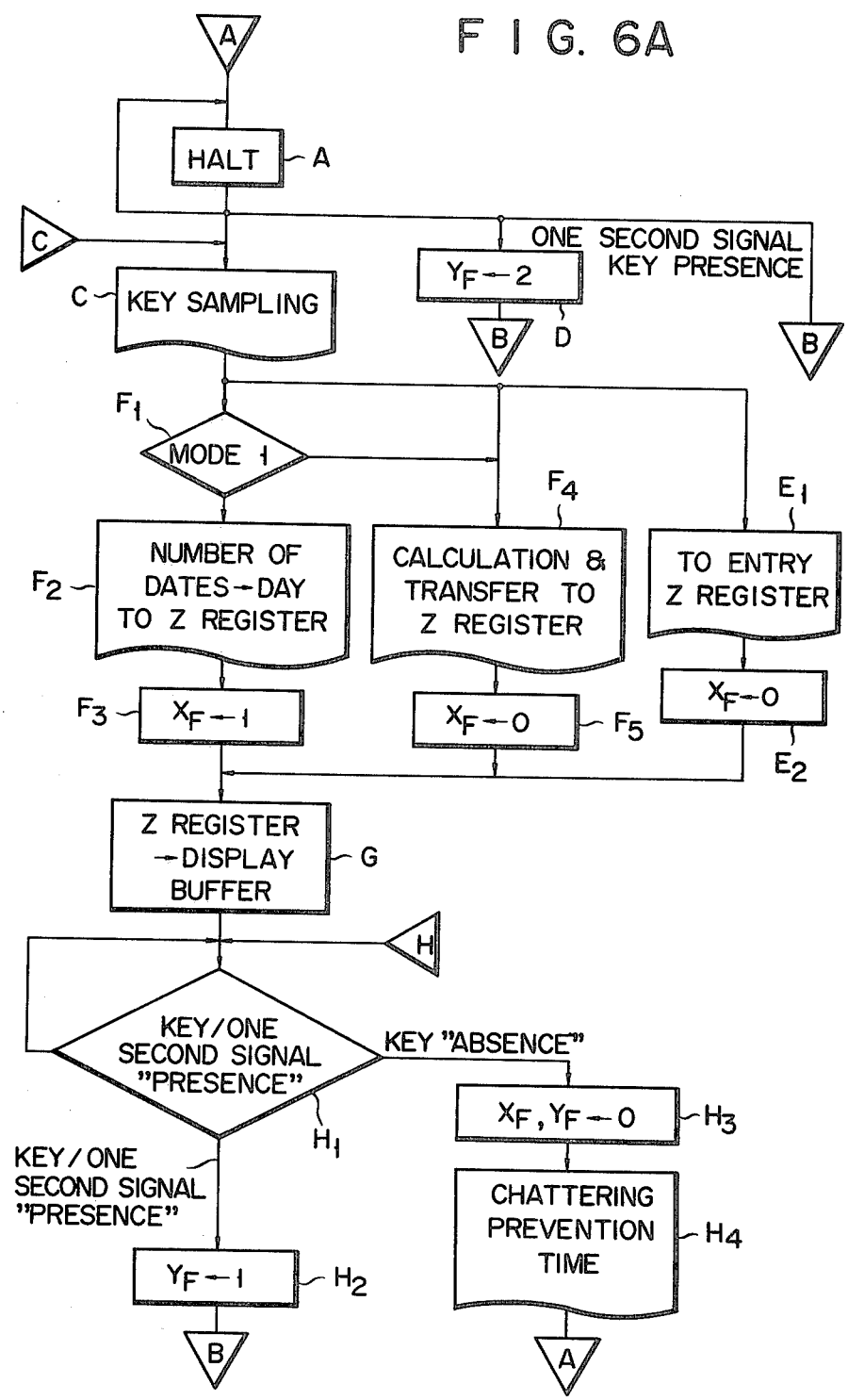
Figure 6C:
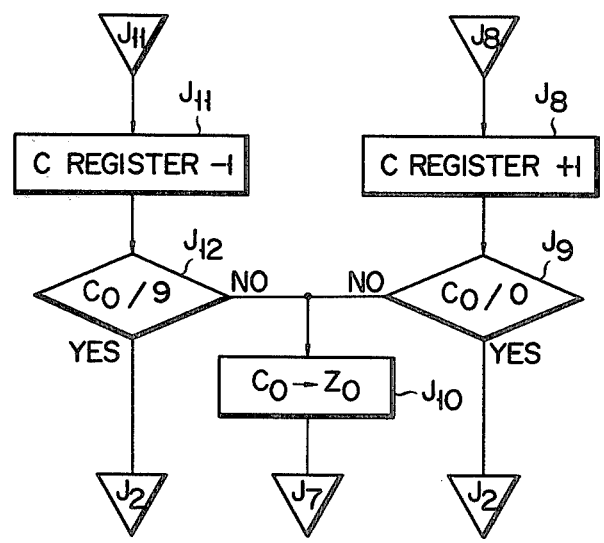
Figure 7A:
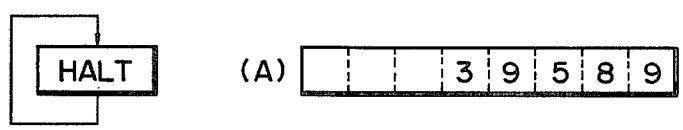
FIGS. 7A to 7E illustrate the changes of the contents of A register, Z register, display buffer and display, when the given operations shown in FIGS. 6A and 6B are executed.

A display control will first be given when the time counting function is selected by the mode switch provided on the key board $38_1$. The frequency divider $16_2$ of the time counting pulse generator 16 produces a one-second signal which in turn is applied to the R-S flip-flop $16_4$ via the one-shot circuit $16_3$. The ROM 11 is held in "HALT" condition shown in the step A in FIG. 6A and in FIG. 7A till the R-S flip-flop $16_4$ is in a set state. The NOR gate 27 produces the address control signal $\phi_{ROMA}$ depending on the signal $\phi_{ROMA2}$ of the instruction decoder 15 and the situation at this stage is in waiting a set output signal from the R-S flip-flop $16_4$. In the "HALT" condition, the ROM 11 produces an instruction signal "11001" and the instruction decoder 15 produces the control signal $O_{12}$. Accordingly, the AND gates 18 and 40 are ready for enabling. Assumption is again made that the A register has stored second data "39589" already time-counted, as shown in FIG. 7A. Then, the frequency dividing circuit $16_2$ of the time counting pulse generator 16 produces a one-second signal which in turn sets the R-S flip-flop $16_4$. Upon the set state of the R-S flip-flop $16_4$, the Q output signal of the R-S flip-flop $16_4$ is transferred via the AND gate 18 to the addressing circuit $13_1$ so that the address contents of the ROM is renewed. The renewed ROM address data is decoded in the address decoder 14 and then is applied to the address input terminal of the ROM 11. Upon this, the program step in the ROM 11 progresses to reach a step $B_1$ shown in FIG. 6B. The step $B_1$ resets the R-S flip-flop $16_4$. The resetting is performed in such a manner that the ROM 11 produces a given instruction signal which is decoded by the instruction decoder 15 and the decoded signal is applied "reset" signal to the R-S flip-flop $16_4$. Following the step $B_1$, a step $B_2$ is executed as shown in FIG. 6B, in which the "+1" second calculation is executed to the A register. That is, the ROM 11 produces the signal $(S_U)$ for specifying the A register, the signals $(F_L)$ and $(S_L)$ for specifying the 1st to 8th digits of the register, and the instruction signal (INS), and the like. The timing signal $t_1$ outputted from the timing decoder enables the gate $G_2$ and the control signal $O_1$ outputted from the instruction decoder 15 enables the gate $G_3$ so that the contents of the first digit "$A_0$" of the A register is read out at the timing of $t_1$. The contents of the A register is loaded into the buffer register 21 at the timings $t_1$ and $\phi_1$. The contents "$A_0$" is "9". The contents of the $F_L$ is transferred to the adder 20 via the bus line i during this period $t_1$. At this time, the flip-flop 25 is still in a reset state and the instruction decoder 15 produces the signal $O_{10}$. Accordingly, the AND gate 29, upon receipt of the timing signal $t_1$, produces a carry signal toward the adder 20. For this, the contents of the signal $(F_L)$ inputted to the adder circuit is outputted with "+1", and the column address signal "1" is stored in the buffer register 22. Then, the timing decoder 17 produces the timing signal $t_2$. Upon the timing signal $t_2$, the code "1" outputted from the ROM 11 is inputted to the adder 20 via a gate $G_{18}$. At the same time, the contents "9" stored in the buffer register 21 is inputted into the adder 20 via the gate $G_6$. Additionally, the addition instruction outputted from the instruction decoder 15 is transferred to the adder 20 where "9"+"1" is executed. In this addition, a carry is produced to be stored in the adder 20.

Figure 7B:
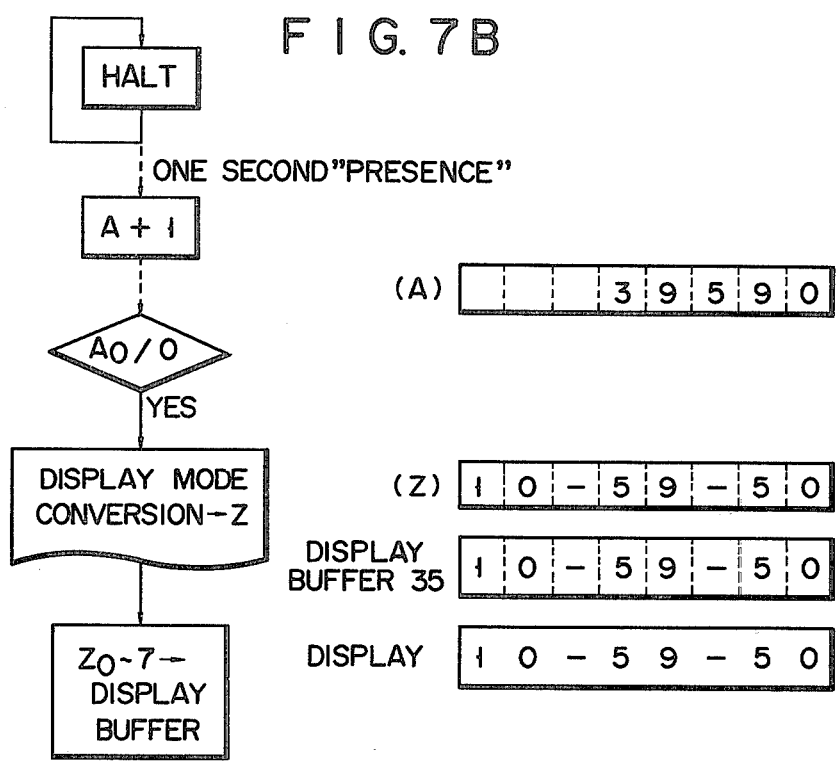
Figure 7C:
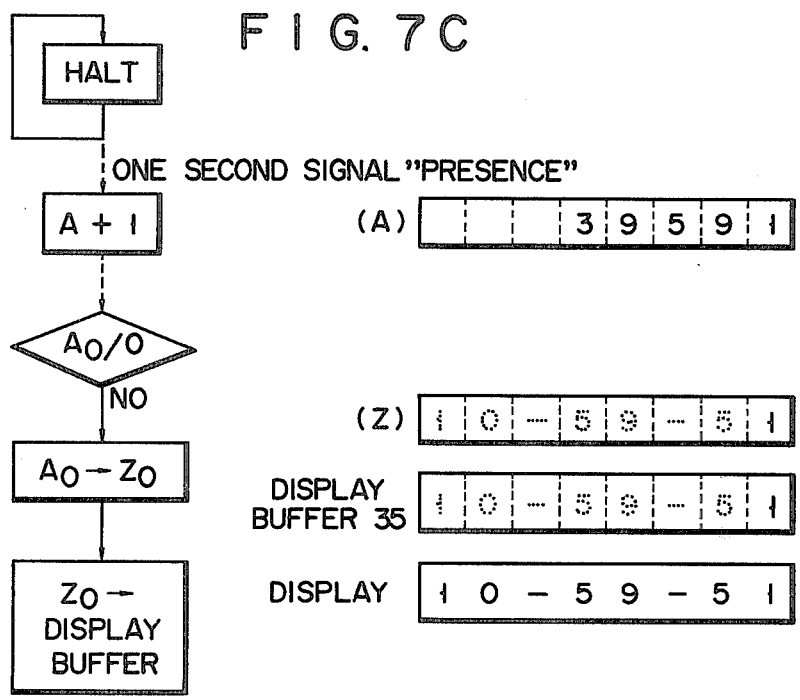
Figure 7D:
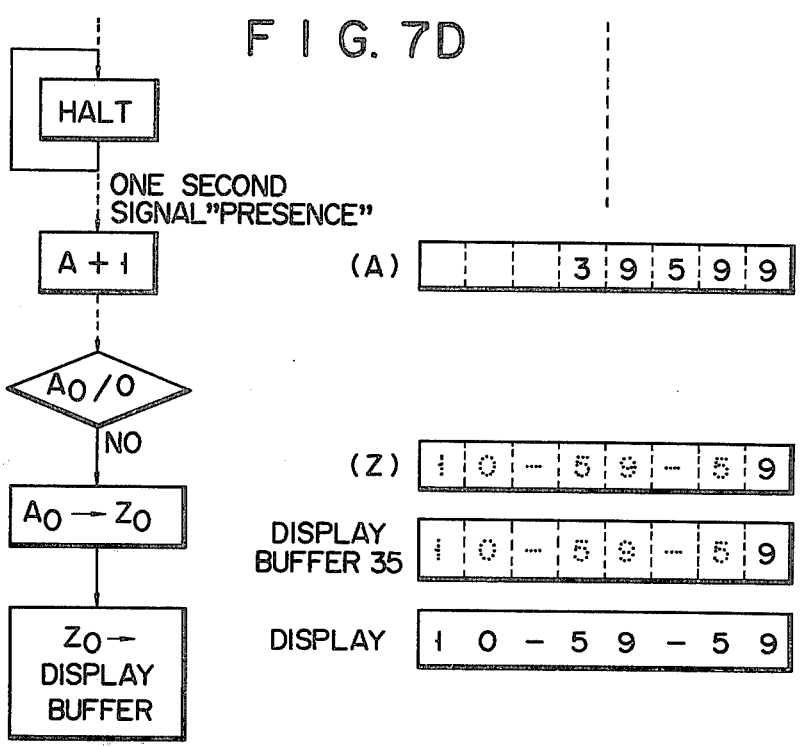
Figure 7E:
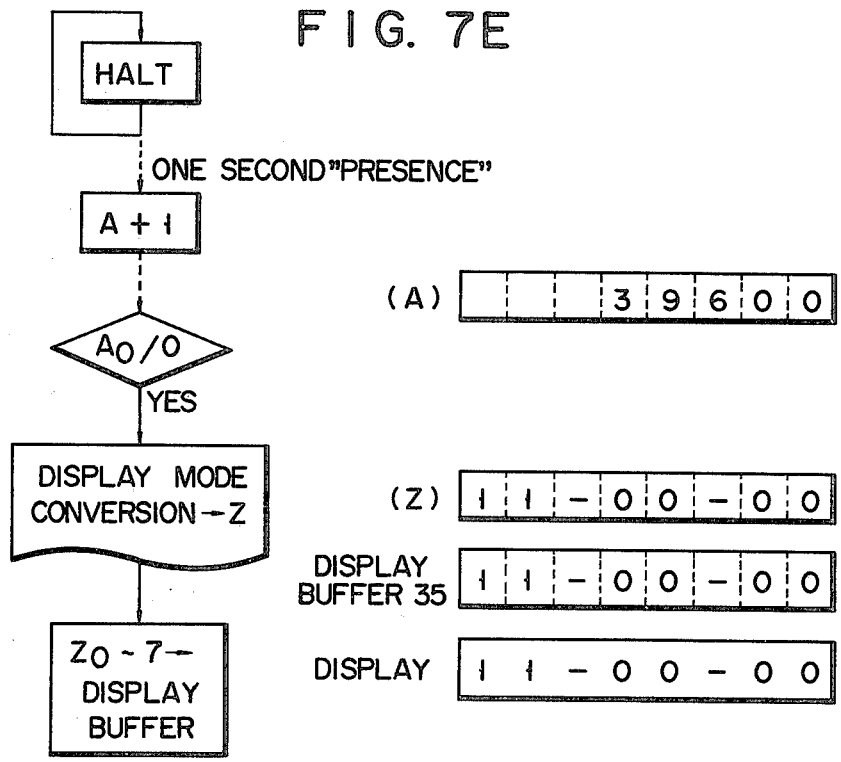
Figure 8A:
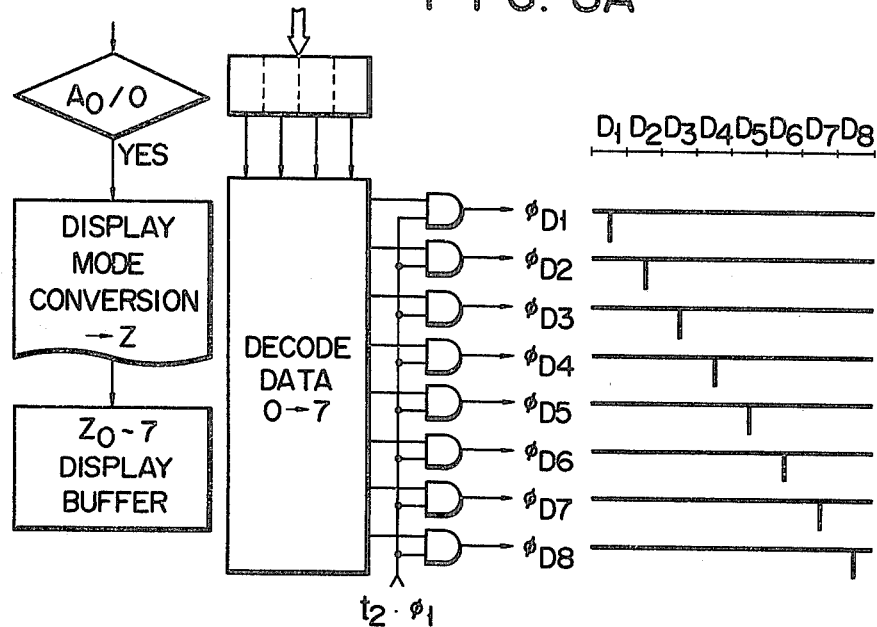
FIGS. 8A to 8B illustrates the state of the display clock outputted from the display clock generating section in FIG. 1B and the given operation steps shown in FIG. 6B.
Figure 8B:
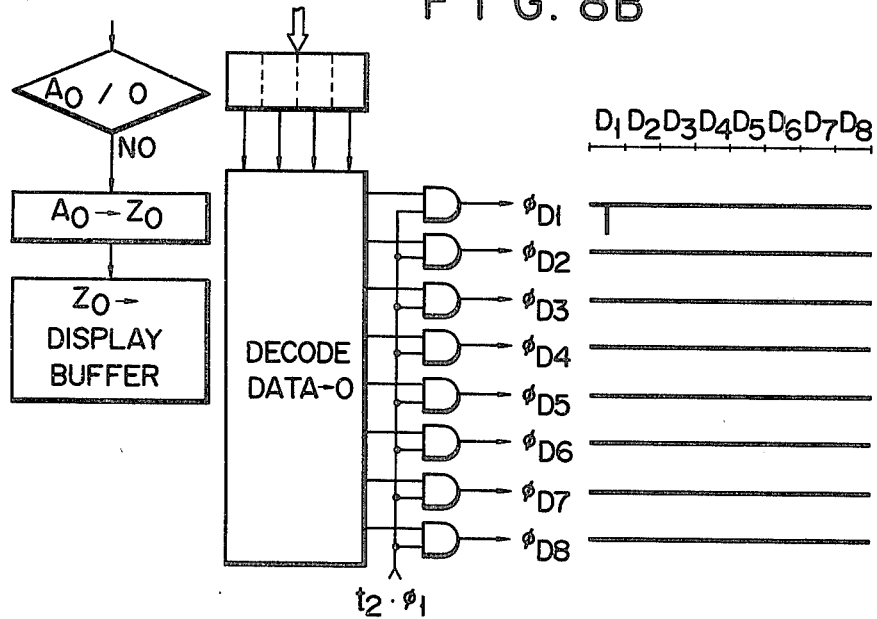

When the timing decoder 17 produces the timing signal $t_3$, a write-in signal is applied via the gate $G_{11}$ to the "R/W" terminal of the RAM 12 and the result of the calculation "0" outputted from the adder 20 is loaded into the "$A_0$" of the RAM 12. The timing signals $t_1$ to $t_3$ terminates the calculation and renewal of the first digit, i.e. "$A_0$", of the A register in the RAM 12. Then, the timing decoder 17 produces again the timing signal $t_1$. Upon the outputting, the instruction decoder 15 produces the control signal $O_8$ so that the contents, i.e. the column address signal "1", stored in the buffer register 22 is applied to the column address input terminal (RAL) of the RAM 12 via the gate $G_{10}$. In this case, the signal $(S_U)$ for specifying the A register is supplied to the row address input terminal (RAU) of the RAM 12 via the gate $G_2$, as in the case of the first digit calculation mentioned above. Therefore, the contents of the second digit "$A_1$" of the A register, i.e. "8", is read out and stored in the buffer register 21. During the time period of $t_1$, as in the first digit calculation, the AND gate 29 produces a signal and "+1" is added to the column address signal "1" inputted to the adder 22 via the bus line i. The column address signal "2" added is stored in the buffer register 22. Then, the timing decoder 17 produces the timing signal $t_2$ so that the contents "8" of the "$A_1$" stored in the buffer register 21 is transferred to the adder 20 via the gate $G_6$. In the adder 20, the contents "8" is added to the carry occurred in the first digit calculation. Accordingly, the adder 20 produces "9" of the result of the calculation. The data "9" is loaded into the "$A_1$" of the RAM 12 in synchronism with the timing signal $t_3$. In this manner, the renewal operation of the second data stored in the A register of the RAM 12 is successively performed from the lower digit to the upper. The contents of the buffer register 22 is "7" and when the contents, i.e. the column address signal "7", is applied to the column address input terminal of the RAM 12 via the gate circuit $G_{10}$, the contents of the "$A_7$" (the 8th digit of the A register) is stored in the buffer register 21 by the signals $t_1$ and $\phi_1$ and then is transferred to the adder 20 at the time $t_2$, and is loaded into the digit "$A_7$" of the RAM 12. The column address signal "7" outputted from the gate circuit $G_{10}$ coincides with the contents of the signal "$S_L$" from the ROM 11 so that the output from the coincident circuit 23 is "1". Further, the output signal of the AND gate 24 becomes "1" in synchronism with the timing signal $t_3$ (at the time of loading into the digit "$A_7$"). As a result, the R-S flip-flop 25 is in a set state so that the AND gate 29 is closed. At the same time, the AND gate 26 is open in synchronism with the clock pulse $\bar{\phi}_1$ so that the NOR gate 27 produces the address control signal $\phi_{ROMA}$ for processing to the next step. In this manner, the "+1" (second) of the A register of the step $B_2$ shown in FIG. 6B is completed and the second data "39590" as shown in FIG. 7B is stored in the A register. The address control signal $\phi_{ROMA}$ proceeds the step to the step $B_3$ shown in FIG. 6B. The address stepping is performed by applying the address control signal $\phi_{ROMA}$ to the addressing circuit 13. That is, upon such an application, the next address read out from the ROM 11 is loaded into the address register 131. Incidentally, the address control signal $\phi_{ROMA}$ is produced by an output from the coincident circuit 23 at the end of the A register renewal. The address decoder 14 decodes the contents of the address register 131 and send the decoded one to the ROM 11. Upon the decoded signal, the ROM 11 produces a new micro-instruction for the step $B_3$. The $B_3$ judges whether the contents of the A register reaches 86400(second)=3600(second)×24(hour) or not. In the judging operation, the ROM 11 produces the "CODE" signal "8,6,4,0,0". The "CODE" signal is sent via the gate circuit $G_8$ and the adder 20 to RAM 12. The RAM 12 stores the (CODE) signal in a given register, e.g. the accumulator register X and subtracts the contents of the A register from the contents of the accumulator register X (in this case, the contents of the A register is not destroyed). That is, at present, "86400−39590" calculation is performed and thus data still remains at the output of the calculation section 14. The data is applied to the judgement circuit 33 via the OR gate 30 to set only the data side of the judgement circuit 33. Accordingly, the outputs $J_H$ and $J_L$ of the judging circuit 33 are "0 and 1" which in turn are sent to the addressing circuit 13. As a result, the address is modified. Then, the processing I is executed. Although not detailed, the address modifying by the respective outputs $J_H$ and $J_L$ is executed by using the circuits like the OR gates 132 and 133. In the processing I, it is judged if the contents of the A register and the B register (date register) are displayed or not. In other words, it is checked if the mode switch of the key board $38_1$ is set to the operation function or not. At present, the "time counting" function is selected by the mode switch on the key board $38_1$. Therefore, the result of the judgement is "time counting" function. The operation advances to the step $J_2$. In the step $J_1$, the mode flag stored in the given region of the RAM 12 is inputted to the adder 20, as in the case of the step $B_3$, and, at the same time, the judging code is applied via the gate $G_8$ to the adder 20. The data resulting from the subtraction and the state of borrow are loaded into the judging circuit 33. The outputs $J_H$ and $J_L$ of the judging circuit 33 are applied to the addressing circuit 13. In the step $J_2$, the judgement of the contents of the flag $X_F$ provided in the accumulator X is performed as in the step $J_1$ and the display of time or date is selected. Assume now that "0" is stored in the flag $X_F$. The details of the setting of the flag $X_F$ will be referred to later. Upon the assumption, the result of the judgement is "YES" in the step $J_2$. Then, the operation shifts to the step $J_3$ shown in FIG. 6B and the step for judging the contents of the digit $A_O$ shown in FIG. 7B. In the step $J_3$, the ROM 11 first produces the signals ($S_U$) and ($S_L$) for specifying the digit $A_0$. The timing signal $t_1$ opens the gate $G_2$ so that the control signal $O_2$ opens the gate circuit $G_4$. As a result, the contents "0" of the $A_0$ is read out from the RAM 12. The contents "0" of the $A_0 i$ stored in the buffer register 21 at the timings $t_1$ and $\phi_1$. The contents "0" of the $A_0$ stored in the buffer register 21 passes through the adder 20 at the timings $t_2$ and $\phi_2$ to the judging circuit 33. The judgement signals $J_L$ and $J_H$ representing "$Y_0=0$" outputted from the judgement circuit 33 are transferred to the addressing circuit 13. The address control signal $\phi_{ROMA}$ based on the signal $\phi_{ROMA2}$ from the instruction decoder 15 is outputted to the NOR gate 27 in synchronism with the timing signal $t_3$ and the clock signal $\phi_1$. As a result, the ROM address data of the address register 131 is renewed on the basis of the judgement signal. The ROM 11 shifts to the processing for display conversion. In the processing operation, the second data "39590" stored in the A register is successively divided by numerals "3600" and "60" to obtain the quotient and the remainder. These are converted into the data "hour", "minute" and "second". The converted one is loaded into the Z register (display register) of the RAM 12, as shown in FIG. 7B. The processing (the processing $J_4$ in FIG. 6B) is not essential to the invention and thus the further detail will be omitted. Upon completion of the display type convertion operation, the NOR gate 27 produces again the address control signal $\phi_{ROMA}$ to specify the next address of the ROM 11 and the operation shifts to the display control operation (the step $J_5$ in FIG. 6B) when $A_O$="0". The condition $A_0$="0" indicates that the contents of the lower digit $A_1$ is changed. Therefore, at this stage, the display data for all the display digits is renewed. In the operation, the signal ($S_U$) for specifying the Z register is outputted from the ROM 11 and the signals $F_L(0)$ and $S_L(7)$ for specifying the first to eight digits are outputted from the same. Additionally, the instruction decoder 15 produces the address stepping instruction $O_{10}$ and the display instruction $O_{11}$. Accordingly, the contents of $Z_0$, i.e. the first digit of the Z register in the RAM 12 is read out at the period of $t_1$. The contents $Z_0$ is "0". The read out one is loaded into the buffer register 21. ($F_L$)=(0) on the bus line i is sent to the adder 20 where "+1" is added to it by the signal outputted at the timing $t_1$ from the AND gate 29, and the added one is stored in the buffer register 22, in the display control buffer register 32. Upon the outputting of the timing signal $t_2$, the contents "0" of the $Z_0$ stored in the buffer register 21 passes through the adder circuit 20 to the data decoder $31_1$ (FIG. 3) of the display processing circuit 31 and then is converted into display segments a to g in the segment encoder $31_2$. The segments signals of the $Z_0$ outputted from the display processing circuit 31 are applied to the input terminals of the respective digits of the display buffer 35. The column address signal "1" stored in the display control buffer register 32 is sent to the decoder $34_1$ at the timing of $\phi_2$ in the display clock generator 34 where it is decoded. The decoder produces a decode signal $D_1$ corresponding to "1" which in turn is taken from the output control gate $A_1$ at the timings $t_2$ and $\phi_2$ in the form of the display control signal $\phi_{D1}$. Then, the signal $\phi_{D1}$ is applied to the corresponding digit, i.e. the first digit, of the display buffer 35 and the display segment signal ("0" display) of $Z_0$ is loaded into the first digit of the display buffer 35. Then, the timing signal $t_1$ is again outputted so that the column address signal "1" stored in the buffer register 22 is applied to the input terminal (RAL) of the RAM 12. Then, the second digit, i.e. the contents "5" of the $Z_0$, of the S register is read out from the RAM 12 and the read out one is stored in the buffer register 21. The column address signal "1" is transferred to the adder 20 where the output signal from the AND gate 29 is added to it. The added column address signal "2" is stored in the buffer register 22 and in the display control buffer register 32. Upon the outputting of the timing signal $t_2$, the contents "5" of the $Z_1$ stored in the buffer register 21 passes through the adder circuit 20 to the display processing circuit 31 where it is converted into the display segment signals which in turn are applied to the input terminals of the respective digits of the buffer 35. In synchronism with the signals $t_2$ and $\phi_1$, the clock signal generator 34 produces the display control signal $\phi_{D2}$ corresponding to the column address signal "2" which in turn is applied to the control terminal of the second digit in the display buffer 35. The display segment signal is loaded into the second digit of the display buffer 35. In this manner, the contents of the Z register is successively loaded from the lower digit thereof into the display buffer 35. The output condition of the display control signals $\phi_{D1}$ to $\phi_{D8}$ in this case is shown in FIG. 8A. Through this operation, the contents of the display buffer 35 is rewritten over the entire digits. Further the contents of the Z register are all loaded renewally into the buffer register 35, as shown in FIG. 7B. The display segment signal stored in the respective digits of the buffer 35 are transferred via the display driver 36 to the display section 37 where it is recognized and displayed. In the loading of the final digit (8th digit) into the display buffer 35, the column address signal "7" stored in the buffer register 22 is applied to the RAM 12 at the timing of $t_1$. Upon this, the RAM 12 produces the contents of $Z_7$ which in turn is stored in the buffer register 21. In this case, the column address signal "7" coincides with the contents of the signal $(S_L)$ from the ROM 11 so that the output of the coincident circuit 23 becomes "1" and the address control signal $\phi_{ROMA}$ from the NOR gate 27 is outputted in synchronism with the timing signals $t_3$ and $\bar{\phi}_1$. This causes the contents of the address register 131 to be renewed and the operation proceeds to the processing K. As described referred to FIG. 4, the processing K judges the destination of the Jump Back depending on the processing executed before the time counting processing routine. That is, as shown in the processing D in FIGS. 4 and 6A, it is judged whether the contents of the flag is larger or smaller than the "1" or equal to it, as in the above-mentioned judging step. The flag corresponds to the flag digit $Y_F$ of the accumulator register Y. In the processing D in FIG. 4 (although not illustrated), when both the AND gates 18 and 40 produce outputs, i.e. the key signal and the one-second signal, the "2" is loaded into the flag $Y_F$ as shown in FIG. 6A. At the present stage, the processing D is not executed and the time counting processing routine is executed so that the result of the judgement in the processing K returns the operation to the "HALT" of th processing A, i.e. the waiting condition for the Q output signal from the flip-flop 164. When the latch circuit 164 of the time counting pulse generator 16 becomes in the set state, the contents of the address register 131 is renewed as mentioned above, and "+1" is added to the contents of $A_0$. At this time, the contents of the A register becomes "39591" as shown in FIG. 7C and, in the contents judgement step of the $A_0$ (the step $J_3$ in FIG. 6B and FIG. 7C), the judge signals $J_L$ and $J_H$ of the judgement circuit 33 exhibit "$Y_0 \neq 0$" and renew the ROM address data in the address register $13_1$ and it advances to the step $J_0$. In other words, it jumps to the program step peculiar to the contents of the judgement signals $J_L$ and $J_H$. See $J_6$ in FIG. 6. The step $J_6$ transfers the contents of the least significant digit of the A register to the same of the Z register. In this step, the ROM 11 produces the signals $(F_U)$, $(S_U)$, $(F_L)$, $(S_L)$ for specifying the $Z_0$ and $A_0$. That is, the signal $(S_U)$ specifies the A register; the $(F_U)$ the Z register; the $(F_L)$ and $(S_L)$ "0", i.e. the first digit. The instruction decoder 15 produces the transfer instruction, one-digit processing mode (M) and the like. Additionally, at the same time the transfer instruction, the gate $G_7$ is closed. At the timing of $t_1$, the first digit of the A register, i.e. the contents $A_0$, is read out from the RAM 12 by specifying of the signals $(S_U)$ and $(S_L)$. And the contents "1" of the $A_0$ is stored in the buffer register 21 at the timings $t_1$ and $\phi_1$. At the next timing of $t_2$, the contents "1" of it passes through the adder 20 to reach the first digit, i.e. $S_0$, of the Z register specified by the signal $(F_U)$ at the timing $t_3$. At timings of $t_3$ and $\phi_1$, the instruction decoder 15 procudes the address control signal $\phi_{ROMA2}$. In this manner, the transfer "$A_0 \rightarrow Z_0$" in the step $J_6$ is completed. That is, at this stage, the $A_0$ is not "0" so that the contents in the second digit and succeeding ones are not changed. As a result, the necessary operation is merely to transfer the contents of the $A_0$ to the $Z_0$. Therefore, the contents of the Z register changes from the state shown in FIG. 7B to that shown in FIG. 7C. The data indicated by dotted line in FIG. 7C represents the data which have already been loaded by the processing shown in FIG. 7B. At the timings $t_3$ and $\phi_1$, the instruction decoder 15 produces the signal $\phi_{ROMA2}$ and the next address is loaded into the address register $13_1$. The operation proceeds to the next step. The next step is $J_7$. The step $J_7$ renewally stores only the contents of the $Z_0$ into the corresponding digit of the display buffer 35. Firstly, the signal "$S_U$" specifies the Z register and the signal "$S_L$" specifies the first digit, i.e. "0". For this, at the timing $t_1$, the contents of $Z_0$, i.e. "1", is stored in the buffer register 21. At the timing of $t_1$, the contents "0" of the signal $(S_L)$ is transferred to the adder 20 via the gate $G_4$ and the bus line i. In this adder 20, the output signal from the AND gate 29 adds "+1" to it. The column address signal "1" with "+1" added is stored in the display control buffer register 32 at the the timings $t_1$ and $\phi_1$. At the timing $t_2$, the contents of "1" of the $Z_0$ stored in the buffer register 21 is transferred to the display processing circuit 31 where it is converted into the display segment signal. The converted segment signal is transferred to the data input terminal of digits. At the timings $t_2$ and $\phi_2$, the column address signal "1" of the display control buffer register 32 is transferred to the display clock generating section 34 which produces the display control signal $\phi_{D1}$ corresponding to the column address signal "1" at the timings $t_2$ and $\phi_1$. As a result, the first digit of the display buffer 35 is renewed. Then, the processing K is executed as in the above-mentioned manner, with the result that the operation is placed in the "HALT" of the processing A shown in FIG. 6A. The output condition of the display control signal at this time is shown in FIG. 8B. In this way, in the basic time counting mode, there is no change in the contents of the $A_1$ and upper digits (this is correspondingly applied to the data of display converted on the basis of the A). Accordingly, the display control signal is outputted as to only the one digit so that only the corresponding digit of the display buffer is rewritten. The operation during the period from FIG. 7C to FIG. 7D, i.e. the operation in which the contents of the $A_0$ is between "1" and "9" is similar to that when $A_0=$"1". Therefore, the details of it will be omitted. FIG. 7E shows the display control condition when $A_0=$"0" as in the case of FIG. 7B. As shown in this example, there is a case where the contents of all the digits are changed. Accordingly, when $A_0=$"0", the display control signals $\phi_{D1}$ to $\phi_{D8}$ for all the digits of the display buffer 35 are outputted to renew all the digits contents of the display buffer 35. In FIG. 6B, when the mode judging step $J_1$ judges the up-count mode, the counting value (second data) is loaded in the C register of the RAM 12, as shown in the steps $J_8$, $J_9$ and $J_{10}$ of FIG. 6C, and the control mode is determined depending on whether $C_0=$"0" or not. The operation in this case is similar to the basic time counting mode, i.e. the processing of the A register, thus omitting of the explanation of the details thereof. In FIG. 6B, when the down-count mode such as timer operation is judged in the step $J_1$ of mode judgement, the counting value (second data) is stored in the C register of RAM 12, as shown in the steps $J_{11}$, $J_{12}$ and $J_{10}$ of FIG. 6C. In this case, the display control system is determined depending on whether $C_0=$"9" or not because of down-count.

The explanation will be given of a case where, when the mode switch selects the "time counting" function, the second specified key $\boxed{D}$ on the key board is operated to display the date data. Before preceding with the detailed explanation, the following assumption is made for easy of explanation. The contents of the A register is "86397" (second). The contents of the B register "722127" (day). In the Z register is stored "11:59:57 p.m." corresponding to the contents of the A register, "86397", in the form of "11-59-57". The flags $X_F$ and $Y_F$ are "0,0", that is to say, these flags are in the state shown in FIG. 9A. The data stored in the B register is the number of days counted from the virtual standard date March 1, 0 (Anno Domini) up to today, in accordance with the following equation.

$b \geq 3$ $(365.25 \times a) + [30.6 \times (b-3)] + c$ $b < 3$ $[365.25 \times (a-1)] + [30.6 \times (b+9)] + c$ where a is a year, b is a month, and c is day, and, as to the term of year, the decimal places are neglected and, as to the term of month, the fractions of 0.5 and over as a unit is counted and the rest is cast away.

Assume again that the key input and one second signal are not outputted and the calculation is not performed. In such a case, the instruction signal outputted from the ROM 11 is "11001" as shown in FIG. 2. The instruction decoder 15 produces the control signal $O_{12}$ so that the AND gates 18 and 40 are conditioned for enabling, i.e. in the "HALT" state of the processing A in FIG. 6A.

Under this condition, when the frequency divider $16_2$ produces the one-second signal, the R-S flip-flop $16_4$ is set. As a result, the steps $B_1$ and $B_{are\ executed\ to\ reset\ the\ flip-flop}$ $16_4$ and add "+1" to the A register (86397+1=86398). In the step $B_3$, since the contents, 86398, of the A register is smaller than 86400, the operation proceeds to the processing I. In the processing I, since the mode switch of the key board $38_1$ has selected the "time counting" function, the judgement is made as the "time counting" function and thus the steps $J_2$ and $J_3$ are executed as in the above case. In the step $J_3$, the fact that the contents of the $A_0$ is not "0" causes the operation to proceed to the step $J_6$ where the contents of the $A_0$, i.e. "8", is transferred to the $Z_0$. See FIG. 9A. The contents of the $Z_0$ is sent to the display buffer 35 as in the above case, in the step $J_7$, and then is visualized in the display 37. Then, the operation proceeds to the processing K to judge the step from which the operation has jumped to this time counting routine. If it has jumped from the processing A of the "HALT", the flag $Y_F$ is "0" as shown in FIG. 9B, and thus the result of the judgement of the processing K causes it to return to the processing A of the "HALT".

Another case will be given in which the second specifying key $\boxed{D}$ for displaying the date is operated between "11:59:58 p.m." and "11:59:59 p.m.". Upon completion of the step and the processing, the system operation is in the "HALT" condition of the processing A. Accordingly, the instruction decoder 15 produces the control signal $O_{12}$. Under this condition, if the key $\boxed{D}$ on the key board $38_1$ is operated, the key operation output signal is applied to the AND gate 40 via the key buffer $38_2$ and the OR gate 40. Accordingly, the AND gate 40 produces the "1" which is in turn applied to the address register $131b$ via the OR 132. For this, the addressing circuit 13 is address-modified and the operation advances to the processing C. The processing C executes the key sampling processing. Through this processing, the operation of the key $\boxed{D}$ is detected. Following the detection of the second specifying key, the operation proceeds to the step $F_1$ where the mode flag is judged as in the processing K. At present, the "time counting" function is selected by the mode switch of the key board $38_1$. The step $F_1$ judges the operation to be in the "time counting" mode so that the operation proceeds to the processing $F_2$. Incidentally, the reason why the mode flag is judged in the step $F_1$ is that, in this example, the specifying key $\boxed{D}$ is used for both the "time counting" and "calculation" functions. In the processing $F_2$, the days data "722127" which correspond to the number of days counted from the virtual standard day, March 1, 0, up to now and stored in the B register are converted into the form of the date "77-03-28" (Mar. 28, 1977). The date data converted is stored in the Z register and the operation proceeds to the step $F_3$. The step $F_3$ raises the flag $X_F$ for indicating the fact that the data in the date format are stored in the Z register. In this step, the ROM 11 produces the (CODE) signal (1) which in turn is loaded into the flag $X_F$ region of the RAM 12 through the gate $G_8$ and the adder 20. Following this step, the processing G is executed in which the contents of the Z register is transferred into the display buffer 35 as in the step $J_5$ and then is visualized in the display section 37. The contents of the registers A, B and Z, and the flags $X_F$ and $Y_F$ are as shown in FIG. 9C. Upon completion of the processing G, the operation proceeds to the step $H_1$. The step $H_1$ judges whether the same key as when it is jumped from the step A is still pressed or not. If the key is continuously pressed, the execution of the step $H_1$ will be repeated. That is, in the step $H_1$, the instruction signal (INS) is "110010" as shown in FIG. 2 so that the control signal $O_{12}$ is produced and the key operation output from the key board $38_1$ is always applied to the address register 131b, by way of the key input buffer 38₂, OR gate 39, AND gate 40, and OR gate 132. And the addressing circuit 13 maintains its state. When the one-second signal is produced from the frequency divider 16₂ and the R-S flip-flop 16₄ is set, the Q output signal "1" of the flip-flop is applied to the address register 131a by way of the AND gate 18, and the OR gate 133. As a result, the address is modified in the addressing circuit 13 and the step is shifted to the step $H_2$. The step $H_2$ raises the flag $Y_F$ (setting it to "1") for setting the step to be next executed on the basis of the judgement of the processing K. The operation of this is similar to that of the step $F_3$ except that the $Y_F$ region is specified from the ROM 11. Upon completion of the step $H_2$, the step is shifted to the step $B_1$. In the step $B_1$, the processing I and the steps $B_1$ to $B_3$ and $J_1$ are executed as mentioned above and the step advances to the step $J_2$. At present, the flag $X_F$ is "1" as shown in FIG. 9C and therefore the result of the judgement at this step $J_2$ is "NO" and the processing $J_8$ like the processing $F_2$ is executed. The result of it is stored in the display buffer 35 in the step $J_5$ and then the step proceeds to the processing K. The conditions of the respective registers A, B and Z and the flags $X_F$ and $Y_F$ at this time are shown in FIG. 9D. As a result of the judgement in the processing K, it is found that it is impossible to raise "1" in the flag $Y_F$ in the step $H_2$. For this, the step returns to the step $H_1$ where the key operation is released or the execution of the step $H_1$ continues till the one-second signal is produced. In this manner, the one second signal is again produced from the frequency divider 16₂ so that the R-S flip-flop 16₄ is set. Upon the setting, the address register 131a is set and the steps $H_2$, $B_1$ and $B_2$ are executed. As a result of the execution of the step $B_2$, the contents of the A register is "86400". The step $B_4$ follows the step $B_3$. The result of the subtracting the contents of the time counting register A from the contents (86400) is "0" and the judging circuit 33 is not set to produce "0,0" at the outputs $J_L$ and $J_H$. Accordingly, this judgement results in no address modification in the addressing circuit 13 and the step advances to the step $B_4$ in accordance with the next address (NA) outputted from the ROM 11. The step $B_4$ applies "+1" to the B register (722127+1). The operation is similar to that of the step $B_2$ except that the contents of the B register is outputted from the RAM 12. The result of the calculation is "722128". Upon completion of the step $B_4$, the step $B_5$ is executed to clear the contents of the A register. The clear operation is performed by subtracting the contents of the A register from the contents (86400) of the A register in the adder 20 or in such a manner that the (CODE) signal of the ROM 11 is made zero and it is loaded into the A register. Upon the completion of the step $B_5$, the processing I and the steps $J_1$ and $J_2$ are executed and then the operation proceeds to the processing $J_8$. The processing $J_8$ converts the contents of the B register into the format of date which in turn is loaded into the Z register. In the step $B_4$, "1" is added to the date register B and the "722128" is stored therein so that, as a result of the processing $J_8$, "77-03-29" is loaded into the Z register. The contents of the registers A, B and Z and the flags $X_F$ and $Y_F$ at this time are as shown in FIG. 9E. When the processing $J_8$ is completed, the steps $J_5$ and the processing K are executed and the operation returns to the step $H_1$. At this time, as seen from FIG. 9E, although an operator continues the key depressing, the date renewed in accordance with the change of the date is displayed in the display device 37 so that the operator can obtain correct date.

When the key pressing of the specifying key ⎕D is released during the step $H_1$, the operation proceeds to the step $H_3$ so that the flags $X_F$ and $Y_F$ are cleared by the operation similar to the step $B_5$ and then the processing $H_4$ is executed. The processing $H_4$ prevents erroneous input signals due to chattering when the key pressed is released. After completely avoiding the chattering time resulting from the key characteristic, the operation returns to the "HALT" of the processing A. When the one-second signal presents in the "HALT" condition of the processing A, the time counting is performed to the A register through the operation similar to that described in FIG. 7B. As shown in FIG. 9F, "12-00-01" (12:00:01 a.m.) is stored in the Z register.

In the calculation mode, when the key operation output signal is applied to the address register 131b in the "HALT" condition of the processing A, the processing C detects what is the key depressed. The system operation proceeds to the processing $E_1$ where the entry processing is performed. The result of the entry processing is stored in the display register Z. The operation of the processing $E_1$ is similar to that of an ordinary small size electronic calculator and this is not essential to the present invention. Therefore, the explanation of it will be omitted. After the processing $E_1$, the step $E_2$ is executed in which the flag $X_F$ is cleared through the operation similar to that in the step $H_3$. Then, the operation is shifted to the processing G. When the processing C detects the operation of the function key, the mode switch of the key board 38₁ selects the "calculation" function even when the specifying key ⎕D is depressed. When it is detected in the step $F_1$, the operation advances to the processing $F_4$. In the processing $F_4$, the calculation of the function key depressed and the calculation operation of the specifying key ⎕D are executed and then the step $F_5$ like the step $E_2$ is executed and then the processing G is executed. When the "calculation" function is selected by the mode switch of the key board 38₁, the result of the judgement of the processing I causes the operation proceeds to the processing K where the contents of the A register is not displayed and "+1" (second) is added to only the contents of it.

In the above example, the jump from the processing A is performed under the presence of the key operation output or the one-second signal. However, when the key operation output and the one-second signal simultaneously pass the AND gates 18 and 40 to be applied to the addressing circuit 13, the processing D shown in FIG. 4 is executed and "2" is loaded into the flag $Y_F$. Then, the time counting operation is executed and thereafter it is jumped to the processing C throug the processing K. In the processing C, the key sampling, calculation and like are performed.

In the above example, the time counting pulse of one-second is used as a time counting unit; however, 1/10, 1/16, 1/100 or other proper second may be used for the time counting unity pulse.

Additionally, in the above example, the time counting registers (A or C register) are used for converting hours and minutes into seconds. Instead of such, the time counting may be made in the scale of 12, the scale 24 and the scale of 60 and, if necessary, any suitable scale, for example, n scale, may be employed for the time counting. Accordingly, the judgement of the display data to be sent to the display buffer may be performed by employing a judgement mode complying with the scale of n, as in the case of the scale of 10. The digits to be changed may be those relating to the scale of n or all the digits.

The orders of the respective processings or steps shown in FIG. 4 or FIGS. 6A, 6B and 6C are not limited to those in the described embodiment and may be changed properly. Other processing or steps which bring about much the same results may be employed.

Obviously many modifications and variations of the present invention are possible in the light of the above teachings. It is therefore to be understood that within the scope of the appended claims, the invention may be practiced otherwise than as specifically described.

What is claimed is:

1. An electronic calculator with a time-counting function, comprising:
    an oscillator for generating reference frequency signals;
    frequency-dividing means coupled to said oscillator for dividing the frequency of the output signal of said oscillator to produce time-counting timing signals;
    holding means coupled to said frequency-dividing means for holding an output signal of said frequency-dividing means;
    control means coupled to said holding means for controlling calculation or no operation when said holding means holds no time-counting timing signal and for controlling a time-counting operation when said holding means holds a time-counting timing signal;
    calculation/time-counting means coupled to said control means for carrying out various calculations including a calculation for obtaining time data, under control of said control means;
    memory means coupled to said calculation/time-counting means for storing the time data or other data obtained by said claculation/time-counting means;
    a multi-digit display buffer memory coupled to said memory means for temporarily storing the contents of said memory means;
    display means coupled to said buffer memory for displaying the data contents of said buffer memory; and
    judging means coupled to said buffer memory for judging the digit stored in said buffer memory, by the contents of which the data currently displayed by said buffer memory differs from the data in said memory means to be displayed next by said buffer memory;
    said display means displaying said data under control of the output signal of said judging means.

2. The electronic calculator of claim 1, wherein said judging means operates to control said display means every time said calculation/time-counting means adds a predetermined value to, or subtracts the same from, a specified digit of the data stored in said memory means to thereby renew the contents of said memory means.

3. The electronic calculator of claim 2, wherein said judging means includes means for judging whether the time data in said memory means produces a carry or borrow by calculation already carried out or yet to be carried out by said calculation/time-counting means, provided that the time data are n-scale data each of which consists of a series of digits formed by adding the predetermined value to, or subtracting the same from, the specified digit.

4. The electronic calculator of claim 3, wherein said judging means includes means for applying only the data of said specified digit, already stored or to be stored in said memory means to renew the contents thereof, to said buffer memory to thereby renew the contents thereof when no carry or no borrow is produced by calculation already carried out or yet to be carried out by said calculation/time-counting means and for applying all the data stored in said memory means to said buffer memory to replace all the data stored in said buffer memory when a carry or borrow is produced by calculation already carried or yet to be carried out by said calculation/time-counting means.

5. The electronic calculator of claim 3, wherein the time data stored in said memory means is binary coded decimal data.

6. The electronic calculator of claim 5, wherein said judging means judges only the least significant digit of the time data stored in said memory means and also judges that the second least significant digit of the time data is changed in the time-counting period following the time-counting period when the least significant digit is "9" in the case where said calculation/time-counting means counts upward under control of said control means, or "0" in the case where said calculation/time-counting means counts downward under control of said control means.

7. The electronic calculator of claim 6, wherein said control means includes:
    first control means for transferring all the digits of the time data from said memory means to said buffer memory during the time-counting period following the time-counting period when the least significant digit is "9" in the case where said calculation/time-counting means counts upward, or "0" in the case where said calculation/time-counting means counts downward; and
    second control means for transferring only the least significant digit of the time data from said memory means to said buffer memory during the time-counting period following the time-counting period when the least significant digit has any other value than "9" in the case where said calculation/-tim-counting means counts upward or any other value than "0" in the case where said calculation/-time-counting means counts downward.

8. The electronic calculator of claim 1, wherein said judging means operates to control said display means every time said calculation/time-counting means adds a predetermined value to, or subtracts the same from, a specified digit of the data stored in said memory means to thereby renew the time data stored in said memory means when a time-counting timing signal is held in said holding means and causes said control means to control said time-counting operation in said calculation/time-counting means.

9. An electronic calculator with a time-counting function, comprising:
    an oscillator for generating reference frequency signals;
    frequency-dividing means coupled to said oscillator for dividing the frequency of the output signal of said oscillator to produce time-counting timing signals;
    holding means coupled to said frequency dividing means for holding an output signal of said frequency-dividing means;

input means for entering various data and control data;

control means coupled to said holding means for controlling calculation or no operation when said holding means hold no time-counting timing signal and for controlling time-counting operation when said holding means holds a time-counting timing signal;

calculation/time-counting means coupled to said control means for carrying out calculation or time-counting under control of said control means, using the data from said input means;

memory means coupled to said calculation/time-counting means for storing the time data or calculation data obtained by said calculation/time-counting means;

a multi-digit display buffer memory coupled to said memory means for temporarily storing the contents of said memory means;

display means coupled to said buffer memory for displaying the date contents of said buffer memory;

judging means coupled to said buffer memory for judging the digit of said buffer memory, by the contents of which the data currently displayed by said buffer memory differs from the data in said memory means to be displayed next by said buffer memory; and said display means displaying said data under control of the output signal of said judging means.

10. The electronic calculator of claim 9, wherein said input means is provided with mode-selecting means for setting said calculation/time-counting means in a time-counting mode or a calculation mode, and said judging means operates only when said mode-selecting means selects a time-counting mode, to thereby transfer to said display means only the digit judged by said judging means so as to renew the data currently displayed by said display means.

11. The electronic calculator of claim 10, wherein said input means is further provided with a key for selecting the time-counting mode regardless of the mode selected by said mode-selecting means, and said judging means operates only when said mode-selecting means selects the time-counting mode or said key is operated, to thereby transfer to said display means only the digit judged by said judging means so as to renew the data currently displayed by said display means.

12. An electronic calculator with a time-counting function, comprising:

an oscillator for generating reference frequency signals;

frequency-dividing means coupled to said oscillator for dividing the frequency of the output signal of said oscillator to produce time-counting timing signals;

holding means coupled to said frequency-dividing means for holding an output signal of said frequency-dividing means;

a microprogrammed controller coupled to said holding means for controlling calculation or no operation when said holding means holds no time-counting timing signal and for controlling a time-counting operation when said holding means holds a time-counting timing signal, said microprogrammed controller comprising:

a read only memory which includes sections for storing various control data including instruction signals in calculation processing routines and time-counting processing routines and for storing the address next to the address currently executed;

an addressing section coupled to said read only memory and including a circuit for modifying the address data from the next address-storing section thereof, and an address register;

an address-designating section coupled to said addressing section for designating one of the addresses of said read only memory in accordance with the address data from said addressing section; and modifying signal generating means coupled between said holding means and said address data modifying circuit;

calculation/time-counting means coupled to said microprogrammed controller for carrying out various calculations including a calculation for obtaining time data, under control of said microprogrammed controller;

memory means coupled to said calculation/time-counting means for storing the time data or other data obtained by said calculation/time-counting means; and display means coupled to said memory means for displaying the contents of said memory means.

13. The electronic calculator of claim 12, wherein said modifying signal generating means includes a detector circuit to generate a modifying signal in response to an output signal of said holding means, thereby causing said addressing section to set up a head address of said time-counting processing routine in said read only memory.

14. The electronic calculator of claim 13, wherein said holding circuit comprises a flip-flop circuit.

15. The electronic calculator of claim 14, wherein said detector circuit comprises gate means connected to receive at one input terminal an output of said flip-flop circuit and at another input terminal thereof a given control signal corresponding to an instruction signal from a section of said read only memory for storing control data.

16. An electronic calculator with a time-counting function, comprising:

an oscillator for generating reference frequency signals;

frequency-dividing means coupled to said oscillator for dividing the frequency of the output signal of said oscillator to produce time-counting timing signals;

holding means coupled to said frequency-dividing means for holding an output signal of the frequency-dividing means;

input means for entering various data and control data;

a microprogrammed controller coupled to said holding means for controlling calculation or no operation when said holding means holds no time-counting timing signal and for controlling the time-counting operation when said holding means holds a time-counting timing signal, said microprogrammed controller comprising:

a read only memory which includes sections for storing various control data including instruction signals in calculation processing routines and time-counting processing routines and for storing the address next to the address currently executed;

an address section coupled to said read only memory and including a circuit for modifying the address data from the next address-storing section thereof, and an address register;

an address-designating section coupled to said addressing section for designating one of the addresses of said read only memory in accordance with the address data from said addressing section; and modifying signal generating means coupled between said holding means and said address data modifying circuit;

calculation/time-counting means coupled to said microprogrammed controller for carrying out various calculations including a calculation for obtaining time data, under control of said microprogrammed controller;

memory means coupled to said calculator/time-counting means for storing the time data or other data obtained by said calculator/time-counting means; and display means coupled to said memory means for displaying the contents of said memory means.

17. The electronic calculator of claim 16, wherein said modifying signal generating means receives an output of said input means, an output of said holding means and a given control signal corresponding to an instruction signal which is delivered from a section of said read only memory for storing control data during a waiting period after execution of the calculation and/or time-counting processing routines, thereby producing a modifying signal.

18. The electronic calculator of claim 17, wherein said holding means comprises a flip-flop circuit.

19. The electronic calculator of claim 18, wherein said modifying signal generating means includes a first detector circuit for generating a modifying signal in response to an output signal of said flip-flop circuit, thereby causing said addressing section to set up a head address of said time-counting processing routine in said read only memory.

20. The electronic calculator of claim 19, wherein said first detector circuit comprises gate means connected to receive at one input terminal an output of said flip-flop circuit and at another input terminal thereof a given control signal corresponding to an instruction delivered from a section of said read only memory for storing control data during a waiting period after execution of the calculation and/or time-counting processing routine.

21. The electronic calculator of claim 18, wherein said modifying signal generating means includes a first detector circuit for generating a modifying signal in response to an output of said flip-flop circuit, and a second detector circuit for generating a modifying signal in response to an output of said input means, said input means comprising ten keys for entering numerical data and a plurality of function keys for entering control data, whereby said addressing section sets up a head address of the calculation and time-counting processing routines combined when both the first and second detector circuits generate a modifying signal at the same time.

22. The electronic calculator of claim 21, wherein said first and second detector circuits comprise first and second gate means, respectively, each gate means being connected to receive at one input terminal outputs of said flip-flop circuit and said input means and at another input terminal thereof a given control signal corresponding to an instruction signal delivered from a section of said read only memory for storing control data during a waiting period after execution of the calculation and/or time-counting processing routine, each gate means being made active only when applied with said instruction signal.

23. The electronic calculator of claim 16, wherein said modifying signal generating means further includes a second detector circuit to generate a modifying signal in response to an output of said input means, said input means comprising ten keys for entering numerical data and a plurality of function keys for entering control data, thereby causing said addressing section to set up a head address of said time-counting processing routine in said read only memory.

24. The electronic calculator of claim 23, wherein said second detecting circuit comprises gate means connected to receive at one input terminal an output of said input means and at another input terminal thereof a given control signal corresponding to an instruction signal delivered from a section of said read only memory for storing control data during a waiting period after execution of the calculation and/or time-counting processing routine.

25. The electronic calculator of claim 16, wherein said input means comprises mode-selecting means for setting said calculation/time-counting means in a time-counting mode or a calculation mode; and said modifying signal generating means includes a first detector circuit for generating a modifying signal in response to an output of said holding means and a second detector circuit for generating a modifying signal in response to an output of said input means; said modifying signals from said first and second detector circuits causing said addressing section to set up a head address of said calculation/time-counting processing routine in said read only memory.

26. The electronic calculator of claim 25, wherein said holding means comprises a flip-flop circit.

27. The electronic calculator of claim 25, wherein said first and second detector circuits are connected to said addressing section such that said addressing section sets up a head address of the calculation processing routine prior to a head address of the time-counting processing routine when said first and second detector circuits generate a modifying signal at the same time while said calculation/time-counting means is set in a calculation mode.

28. An electronic calculator with a time-counting function, comprising:

an oscillator for generating reference frequency signals;

frequency-dividing means coupled to said oscillator for dividing the frequency of the output signal of said oscillator to produce time-counting timing signals;

holding means coupled to said frequency-dividing means for holding an output signal of said frequency-dividing means;

control means coupled to said holding means for controlling calculation or no operation when said holding means holds no time-counting timing signal and for controlling a time-counting operation when said holding means holds a time-counting timing signal;

calculation/time-counting means coupled to said control means for carrying out various calculations including a calculation for obtaining time data, under control of said control means;

memory means coupled to said calculation/time-counting means for storing the time data or other data obtained by said calculation/time-counting means;

a converting circuit for converting a multi-digit data read out from said memory means into display signals to be displayed;

a multi-digit buffer memory coupled to said converting circuit for storing the display signals from said converting circuit, each display signal being stored at each digit location in said buffer memory;

write-in control means for controlling the writing of display signals into said buffer memory by supplying read-in clocks of different timings to the digit of said buffer memory, respectively; and display means coupled to said buffer memory for displaying the contents of said buffer memory.

29. The electronic calculator of claim 28, wherein said buffer memory is of the static type such that the contents of a digit applied with a write-in clock from said write-in control means are renewed, whereas the contents of the remaining digits are not renewed so long as they are not applied with write-in clocks.

30. The electronic calculator of claim 28, wherein said converting circuit comprises a segment encoder for converting a data from said memory means into display signals, and the digits of said multi-digit buffer memory are connected to said segment encoder.

31. The electronic calculator of claim 28, wherein said memory means comprises a random access memory, and said write-in control means supplies write-in clocks to the respective digits of said buffer memory in response to address data read out from an address control means for designating the address of said random access memory.

32. The electronic calculator of claim 31, wherein said write-in control means comprises decoder means and gate means coupled to said decoder means, said decoder means decoding data from said address control means to close a specific gate of said gate means, thereby generating write-in clocks or different timings.

* * * * *